(12) United States Patent
Sakakibara et al.

(10) Patent No.: US 10,199,359 B1
(45) Date of Patent: Feb. 5, 2019

(54) THREE-DIMENSIONAL MEMORY DEVICE EMPLOYING DIRECT SOURCE CONTACT AND HOLE CURRENT DETECTION AND METHOD OF MAKING THE SAME

(71) Applicant: SANDISK TECHNOLOGIES LLC, Plano, TX (US)

(72) Inventors: Kiyohiko Sakakibara, Yokkaichi (JP); Satoshi Shimizu, Yokkaichi (JP); Naoto Norizuki, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/669,243

(22) Filed: Aug. 4, 2017

(51) Int. Cl.
| | |
|---|---|
| *H01L 27/115* | (2017.01) |
| *H01L 25/065* | (2006.01) |
| *H05K 7/02* | (2006.01) |
| *H01L 27/06* | (2006.01) |
| *H01L 27/108* | (2006.01) |

(Continued)

(52) U.S. Cl.
CPC ...... *H01L 25/0657* (2013.01); *H01L 25/0652* (2013.01); *H01L 27/0688* (2013.01); *H01L 27/10844* (2013.01); *H01L 27/11568* (2013.01); *H01L 28/88* (2013.01); *H05K 7/023* (2013.01)

(58) Field of Classification Search
CPC ........... H01L 27/1157; H01L 27/11568; H01L 27/11565; H01L 27/11582; H01L 27/11556; H01L 27/11521; H01L 27/11526; H01L 27/11573
See application file for complete search history.

(56) References Cited

U.S. PATENT DOCUMENTS

| | | |
|---|---|---|
| 5,915,167 A | 6/1999 | Leedy |
| 9,666,281 B2 | 5/2017 | Sakakibara |

(Continued)

FOREIGN PATENT DOCUMENTS

WO    WO2017087670 A1    5/2017

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Cuong Q Nguyen
(74) *Attorney, Agent, or Firm* — The Marbury Law Group PLLC

(57) ABSTRACT

A three-dimensional memory device includes a p-doped source semiconductor layer located over a substrate, a p-doped strap semiconductor layer located over the p-doped source semiconductor layer, an alternating stack of electrically conductive layers and insulating layers located over the p-doped strap semiconductor layer, and memory stack structures that extend through the alternating stack and into an upper portion of the p-doped source semiconductor layer. Each memory stack structure includes a p-doped vertical semiconductor channel and a memory film laterally surrounding the p-doped vertical semiconductor channel. A top surface of each p-doped vertical semiconductor channel contacts a bottom surface of a respective n-doped region. A sidewall of a bottom portion of each p-doped vertical semiconductor channel contacts a respective sidewall of the p-doped strap semiconductor layer.

11 Claims, 27 Drawing Sheets

(51) Int. Cl.
*H01L 27/11568* (2017.01)
*H01L 49/02* (2006.01)

(56) References Cited

U.S. PATENT DOCUMENTS

| | | |
|---|---|---|
| 2002/0157750 A1 | 10/2002 | Riva et al. |
| 2002/0190298 A1 | 12/2002 | Alsmeier et al. |
| 2003/0053347 A1 | 3/2003 | Wang et al. |
| 2003/0080371 A1 | 5/2003 | Wang et al. |
| 2003/0139010 A1 | 7/2003 | Wang |
| 2003/0189223 A1 | 10/2003 | Wang et al. |
| 2004/0048436 A1 | 3/2004 | Bonart et al. |
| 2004/0061161 A1 | 4/2004 | Radens et al. |
| 2004/0248364 A1 | 12/2004 | Hsiao et al. |
| 2004/0251485 A1 | 12/2004 | Kito et al. |
| 2005/0051765 A1 | 3/2005 | Rosskopf et al. |
| 2005/0124110 A1 | 6/2005 | Huang et al. |
| 2005/0124111 A1 | 6/2005 | Huang et al. |
| 2005/0127420 A1 | 6/2005 | Kito et al. |
| 2005/0266678 A1 | 12/2005 | Helm et al. |
| 2005/0279983 A1 | 12/2005 | Helm et al. |
| 2005/0285207 A1 | 12/2005 | Kim |
| 2006/0030146 A1 | 2/2006 | Helm et al. |
| 2006/0240617 A1 | 10/2006 | Torii |
| 2007/0033717 A1 | 2/2007 | Anderson |
| 2007/0099382 A1 | 5/2007 | Jung |
| 2007/0290255 A1 | 12/2007 | Helm et al. |
| 2008/0068908 A1 | 3/2008 | Kim |
| 2008/0083941 A1 | 4/2008 | Cheng et al. |
| 2009/0057740 A1 | 3/2009 | Jang |
| 2009/0079030 A1 | 3/2009 | Cheng et al. |
| 2009/0161437 A1 | 6/2009 | Pyeon et al. |
| 2009/0230471 A1 | 9/2009 | Li et al. |
| 2009/0310414 A1 | 12/2009 | Lee et al. |
| 2010/0008141 A1 | 1/2010 | Chu et al. |
| 2010/0102373 A1 | 4/2010 | Li et al. |
| 2010/0193852 A1 | 8/2010 | Cheng et al. |
| 2010/0208516 A1 | 8/2010 | Javerliac et al. |
| 2011/0235424 A1 | 9/2011 | Pyeon et al. |
| 2012/0236647 A1 | 9/2012 | Pyeon et al. |
| 2013/0176790 A1 | 7/2013 | Nguyen et al. |
| 2013/0228840 A1 | 9/2013 | Cheng et al. |
| 2013/0264718 A1 | 10/2013 | Chang et al. |
| 2014/0133236 A1 | 5/2014 | Pyeon et al. |
| 2015/0006826 A1 | 1/2015 | Yong |
| 2015/0087123 A1 | 3/2015 | Wu et al. |
| 2015/0162336 A1 | 6/2015 | Kim et al. |
| 2015/0185764 A1 | 7/2015 | Magi |
| 2015/0206884 A1 | 7/2015 | Barth, Jr. et al. |
| 2016/0005758 A1 | 1/2016 | Hu et al. |
| 2016/0027788 A1 | 1/2016 | Barth, Jr. et al. |
| 2016/0079272 A1 | 3/2016 | Lee et al. |
| 2016/0181264 A1 | 6/2016 | Miyamoto et al. |
| 2016/0240665 A1 | 8/2016 | Chen et al. |
| 2017/0025421 A1 | 1/2017 | Sakakibara et al. |
| 2017/0032535 A1 | 2/2017 | Liaw |
| 2017/0033121 A1 | 2/2017 | Miyamoto et al. |
| 2017/0076755 A1 | 3/2017 | Chang et al. |
| 2017/0117289 A1* | 4/2017 | Liu .................. H01L 27/1157 |
| 2017/0148800 A1 | 5/2017 | Nishikawa et al. |
| 2017/0148811 A1 | 5/2017 | Zhang et al. |
| 2017/0162232 A1 | 6/2017 | Chang et al. |
| 2017/0213846 A1* | 7/2017 | Lee .................. H01L 27/11582 |
| 2017/0338241 A1* | 11/2017 | Lee .................. H01L 27/1157 |

OTHER PUBLICATIONS

U.S. Appl. No. 15/458,200, filed Mar. 14, 2017, SanDisk Technologies LLC.
U.S. Appl. No. 15/458,269, filed Mar. 14, 2017, SanDisk Technologies LLC.
U.S. Appl. No. 15/458,272, filed Mar. 14, 2017, SanDisk Technologies LLC.
U.S. Appl. No. 15/626,444, filed Jun. 19, 2017, SanDisk Technologies LLC.
International Search Report and Written Opinion of the International Search Authority for International Patent Application No. PCTUS2018/034388, Sep. 10, 2018, 14 pages.

* cited by examiner

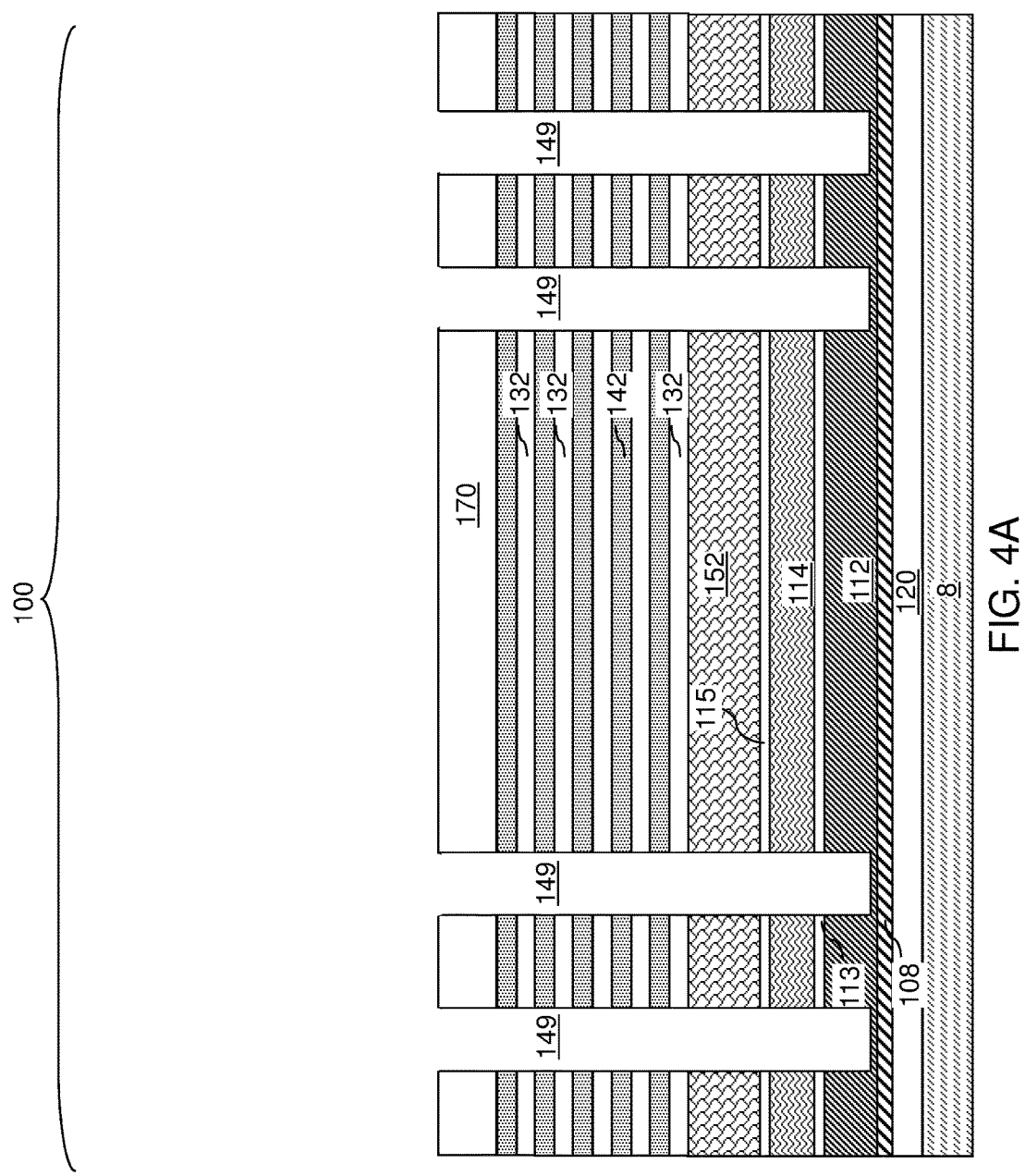

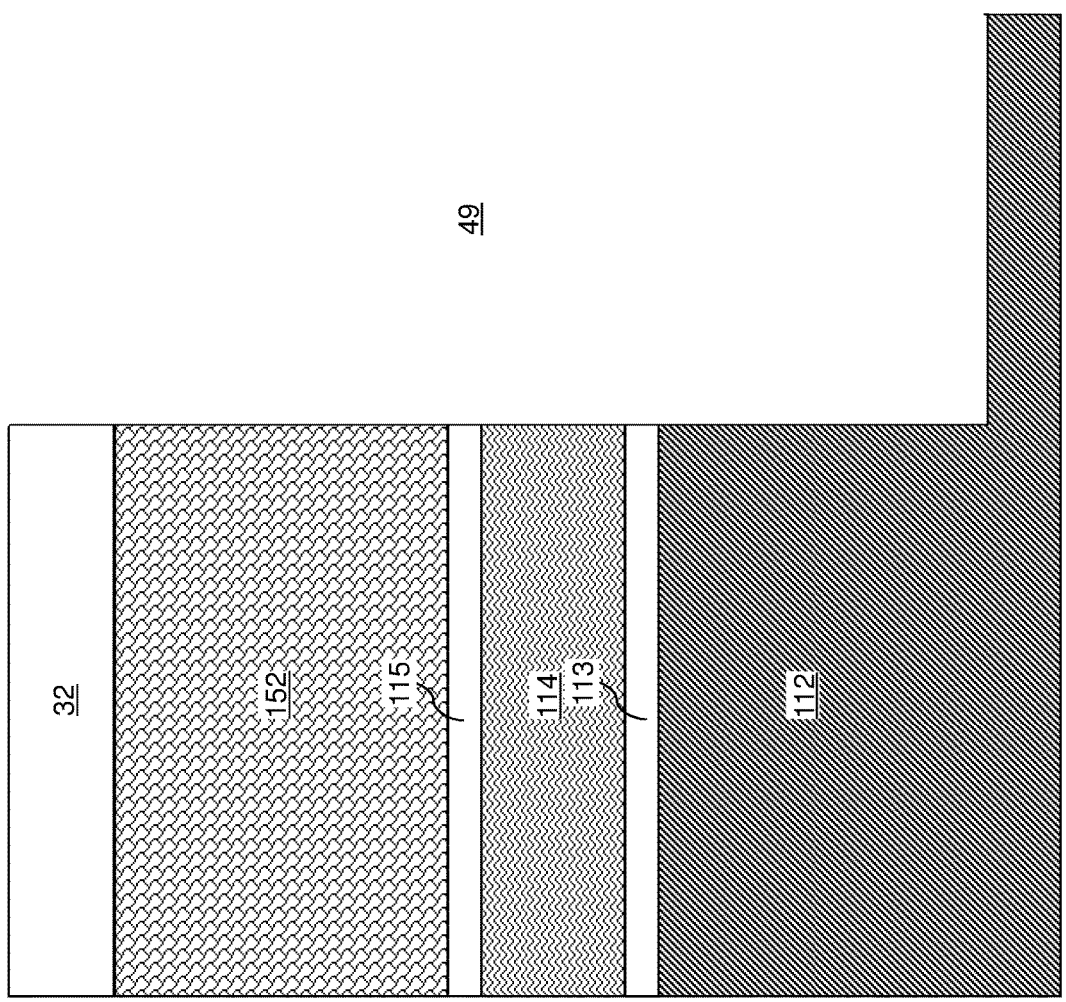

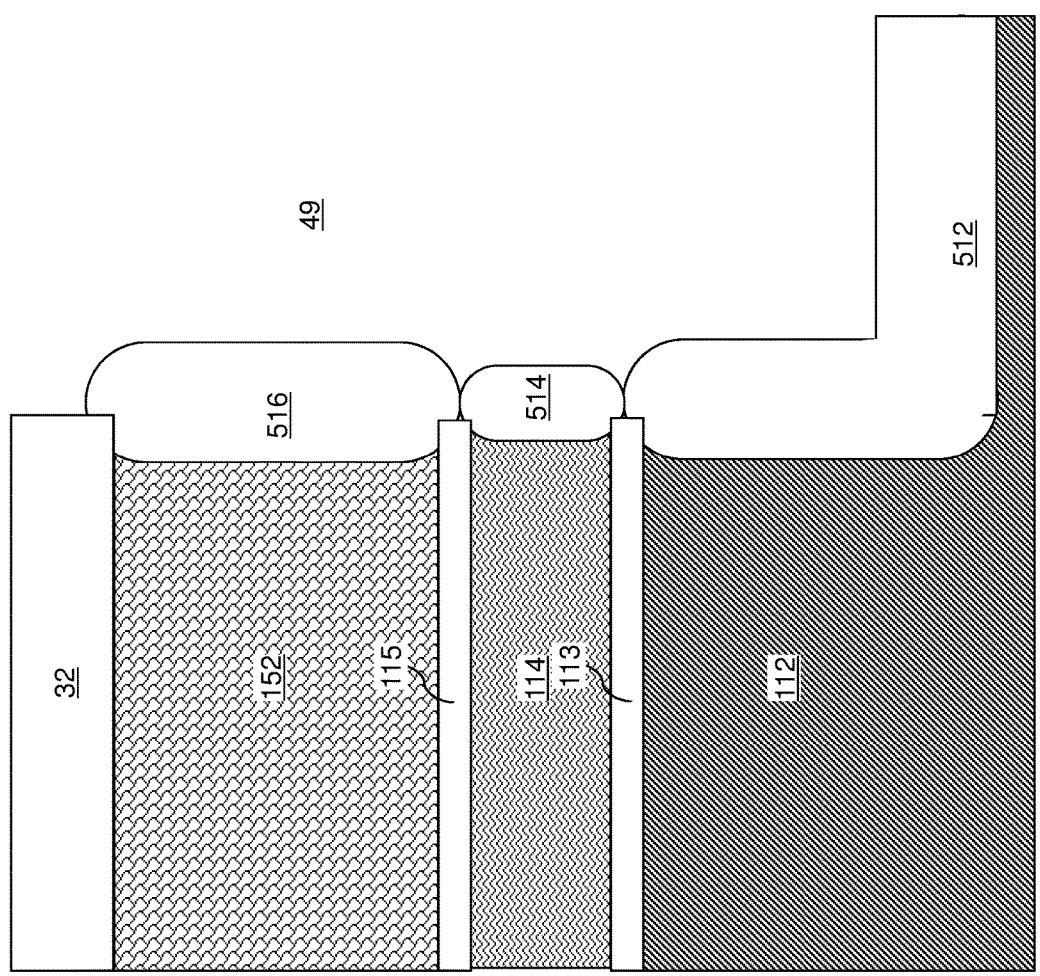

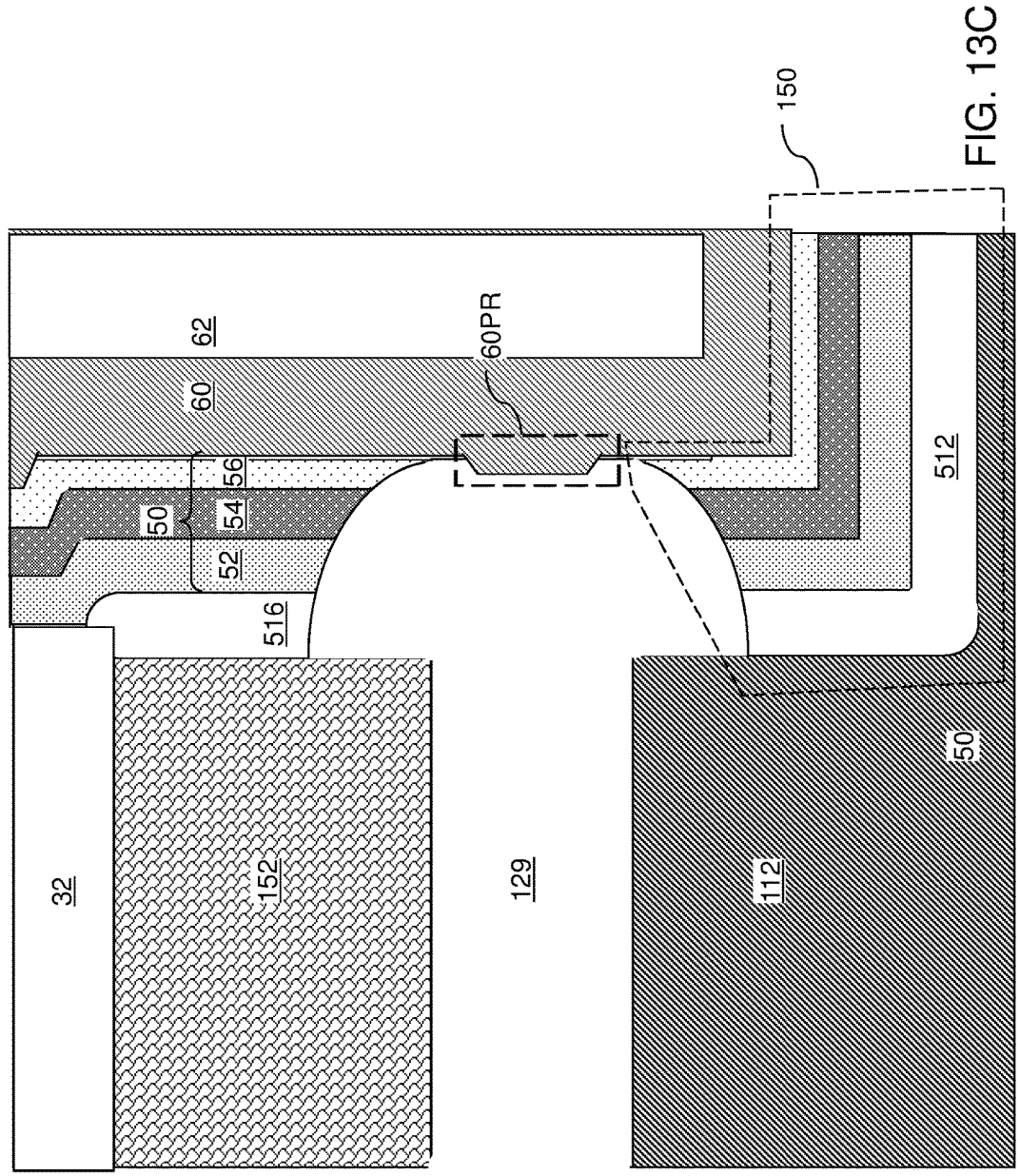

THREE-DIMENSIONAL MEMORY DEVICE EMPLOYING DIRECT SOURCE CONTACT AND HOLE CURRENT DETECTION AND METHOD OF MAKING THE SAME

FIELD

The present disclosure relates generally to the field of semiconductor devices and specifically to a three-dimensional memory structure employing direct source contact and hole current detection and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes a p-doped source semiconductor layer located over a substrate, a p-doped strap semiconductor layer located over the p-doped source semiconductor layer, an alternating stack of electrically conductive layers and insulating layers located over the p-doped strap semiconductor layer, and memory stack structures that extend through the alternating stack and into an upper portion of the p-doped source semiconductor layer. Each memory stack structure includes a p-doped vertical semiconductor channel and a memory film laterally surrounding the p-doped vertical semiconductor channel. A top surface of each p-doped vertical semiconductor channel contacts a bottom surface of a respective n-doped region. A sidewall of a bottom portion of each p-doped vertical semiconductor channel contacts a respective sidewall of the p-doped strap semiconductor layer.

According to another aspect of the present disclosure, a method of forming a three-dimensional memory device is provided. A layer stack including, from bottom to top, a p-doped source semiconductor layer, a lower silicon oxide liner, an undoped sacrificial semiconductor layer, an upper silicon oxide liner, and a p-doped etch stop semiconductor layer is formed over a substrate. An alternating stack of insulating layers and spacer material layers is formed over the semiconductor layer stack, wherein the spacer material layers are formed as, or are replaced with, electrically conductive layers. An array of memory stack structures is formed through the alternating stack and through an upper portion of the p-doped source semiconductor layer, wherein each memory stack structure includes a p-doped vertical semiconductor channel and a memory film laterally surrounding the p-doped vertical semiconductor channel. A source cavity is formed by removing the undoped sacrificial material layer selective to the lower and upper silicon oxide liners and the p-doped etch stop semiconductor layer. Outer sidewalls of the p-doped vertical semiconductor channels can be physically exposed by removing portions of the memory films at a level of the source cavity. A strap semiconductor layer having a p-type doping is formed in the source cavity and contacting the exposed outer sidewalls of the p-doped vertical semiconductor channels.

BRIEF DESCRIPTION OF THE DRAWINGS

FIG. 4A is a vertical cross-sectional view of a memory array region of the exemplary structure after formation of first memory openings according to an embodiment of the present disclosure.

FIG. 4D is a magnified vertical cross-sectional view of a bottom corner of a memory opening of the exemplary structure of FIGS. 4A-4C.

FIG. 5 is a vertical cross-sectional view of a bottom corner of a first memory opening after formation of a silicon oxide cap, a first silicon oxide ring, and a second silicon oxide ring by an oxidation process according to an embodiment of the present disclosure.

FIG. 13C is a magnified vertical cross-sectional view of a bottom corner of a memory opening of the exemplary structure of FIGS. 8A and 8B.

DETAILED DESCRIPTION

Figure 1:
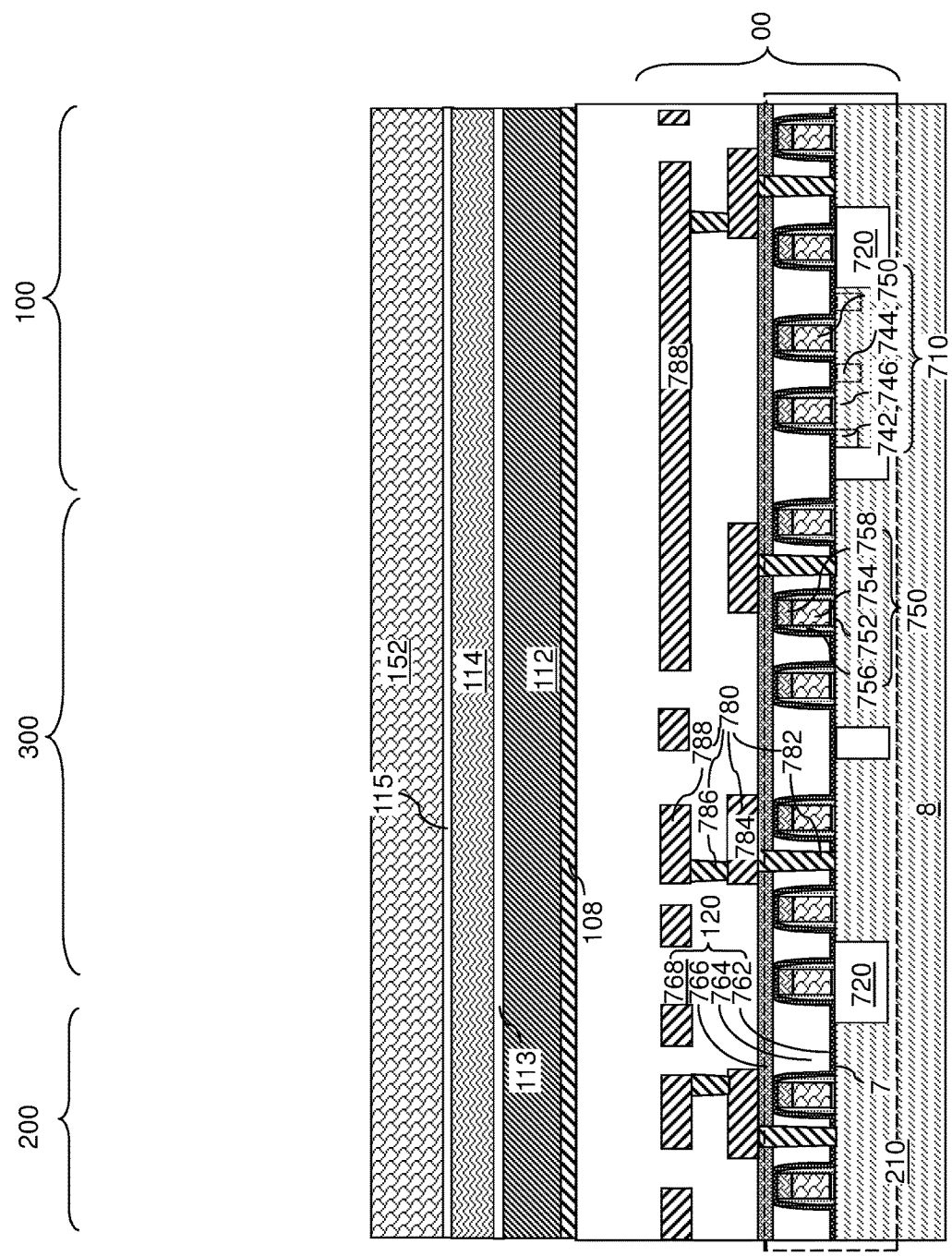
FIG. 1 is a vertical cross-sectional view of an exemplary structure after formation of an optional metallic conductive layer, a p-doped source semiconductor layer, a lower silicon oxide liner, an undoped sacrificial semiconductor layer, an upper silicon oxide liner, and a p-doped etch stop semiconductor layer according to an embodiment of the present disclosure.

A configuration in which electrical contact between bottom portions of vertical semiconductor channels and a buried source line in a vertical (i.e., three-dimensional) NAND device is referred to herein as direct source contact. A doped semiconductor direct strap contact structure of a buried source line can be used as direct source contact for complementary metal oxide semiconductor (CMOS) under array architecture for a three-dimensional memory device, such as a three-dimensional NAND memory device. In such devices, electrons are injected from n-doped semiconductor direct strap contact structures which function as n-type source regions into a p-doped polysilicon channel to provide an electron current for read operations. During programming operations, electrons are stored in charge trapping material portions. During erase operations by gate induced drain leakage (GIDL), electron-hole pairs are generated near the interface between the n-type direct strap contact structures and the p-type semiconductor channels such that holes travel upwards through the semiconductor channels, while the electrons are provided back into the direct strap contact structures. In this case, a large overlap between the n-type direct strap contact structures and a thick source select gate electrode is provided to efficiently generate GIDL electron-hole pairs near the bottom of the semiconductor channel.

Typically, phosphorus or arsenic ions are used to provide the heavily n-type doped diffusion region in the direct strap contact structure adjacent to the channel. The phosphorus or arsenic ions diffuse from an n-doped source polysilicon layer that is formed below the source select gate electrode. However, control of the junction location at the bottom of the channel adjacent to the source select gate electrode is difficult due to the diffusion of phosphorus or arsenic ions that form the junction.

Furthermore, in order to obtain a fast read operation, the resistance of the source select gate electrode should be low. To achieve a low resistance, a heavily doped source select gate electrode (e.g., phosphorus doped polysilicon electrode) can be used. Further, in order for the heavily doped polysilicon material of the source select gate electrode to effectively function as an etch stop layer during formation of memory openings, the source select gate electrode is preferably made as thick as possible. However, selective oxidation of the thick and heavily phosphorus doped source select electrode during formation of multi-tier memory devices may cause a thicker oxide ring to form on the exposed edge the source select electrode than on adjacent semiconductor layers in the memory opening. Such thicker oxide is difficult to strip during subsequent processing steps, which in turn degrades the performance of the source select transistor (e.g., degrades the transistor cut-off characteristics and increases the transistor's channel resistance).

According to an aspect of the present disclosure, the memory device of an embodiment of the present disclosure employs a multi-gated p-n junction diode rather than an n-p-n type muli-gate transistor structure. The lightly doped channel of the multi-gated p-n junction diode forms the p-type portion of the p-n junction diode. The drain region forms the heavily doped n-type portion of the p-n junction diode. However, the device preferably lacks an n-type source region. Instead, the direct strap contact structure comprises a heavily doped p-type semiconductor material which contacts the p-type semiconductor channel and may be considered a portion of the p-type portion of the p-n junction diode having a p+/p−/n+ structure.

In one embodiment, the read (i.e., sensing) operation employs a hole current. In other words, holes are dominant charge carriers in the electrical current employed for the read operation. A heavily p-doped direct strap contact structure is used as a source region to inject holes into the lighter p-doped semiconductor channel during the read operation and during the erase operation. Since the electron-hole pair generation through GIDL current is not used during operation of the embodiment device, the doped semiconductor source select gate electrode (e.g., n-type semiconductor source select electrode) can be omitted. Instead, one or more of the lowest metal gates adjacent to the channel can be used as the source select gate. Further, the channel conductance can be increased, and the contact resistance between a p-doped semiconductor direct strap contact structure and the p-doped source semiconductor layer can be reduced in the structure of an embodiment of the present disclosure.

The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated. The exemplary structure includes a substrate 8, which can be a semiconductor substrate such as a silicon substrate. The substrate 8 can include a substrate semiconductor layer. The substrate semiconductor layer maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate 8 can have a major surface 7, which can be, for example, a topmost surface of the substrate semiconductor layer. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, semiconductor devices 210 can be optionally formed on the semiconductor substrate 8. The semiconductor devices 210 can include, for example, field effect transistors including respective source regions, drain regions, channel regions, and gate structures. Shallow trench isolation structures (not expressly shown) can be formed in an upper portion of the semiconductor substrate 8 to provide electrical isolation among the semiconductor devices. The semiconductor devices 210 can include any semiconductor circuitry to support operation of a memory structure to be subsequently formed, which is typically referred to as a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

The exemplary structure includes the semiconductor substrate 8, and semiconductor devices 210 formed thereupon. Shallow trench isolation structures 720 can be formed in an upper portion of the semiconductor substrate 8 to provide electrical isolation among the semiconductor devices 210. The semiconductor devices 210 can include, for example, field effect transistors including respective source regions 742, drain regions 744, channel regions 746 and gate structures 750. The field effect transistors may be arranged in a CMOS configuration. Each gate structure 750 can include, for example, a gate dielectric 752, a gate electrode 754, a gate cap dielectric 758, and a dielectric gate spacer 756. The semiconductor devices can include any semiconductor circuitry to support operation of a memory structure to be subsequently formed, which is typically referred to as driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one dielectric layer is formed over the semiconductor devices, which is herein referred to as at least one lower level dielectric layer 120. The at least one lower level dielectric layer 120 can include, for example, an optional dielectric liner 762 such as a silicon nitride liner that blocks diffusion of mobile ions and/or apply appropriate stress to underlying structures, a planarization dielectric layer 764 that is employed to provide a planar surface that is coplanar with the topmost surface of the dielectric liner 762 or the topmost surfaces of the gate structures 750, an optional planar liner 766, and at least one lower level interconnect dielectric layer 768 that collectively functions as a matrix for lower level metal interconnect structures 780 that provide electrical wiring among the various nodes of the semiconductor devices and landing pads for through-memory-level via structures to be subsequently formed. The lower level metal interconnect structures 780 can include various device contact via structures 782 (e.g., source and drain electrodes which contact the respective source and drain nodes of the device or gate electrode contacts), lower level metal lines 784, lower level via structures 786, and lower level topmost metal structures 788 that are configured to function as landing pads for through-memory-level via structures to be subsequently formed. The region of the semiconductor devices 210 and the combination of the at least one lower level dielectric layer 120 and the lower level metal interconnect structures 780 is herein referred to an underlying peripheral device region 700, which is located underneath a memory-level assembly to be subsequently formed and includes peripheral devices for the memory-level assembly. The lower level metal interconnect structures 780 are embedded in the at least one lower level dielectric layer 120. In one embodiment, the topmost surfaces of the lower level topmost metal structures 788 may be located at or below a horizontal plane including the topmost surface of the at least one lower level dielectric layer 120.

The lower level metal interconnect structures 780 can be electrically shorted to nodes (e.g., source 742, drain 744 or gate electrodes 750) of the semiconductor devices 210 (e.g., CMOS devices), and are located at the level of the at least one lower level dielectric layer 120.

While a particular pattern for the lower level topmost metal structures 788 is illustrated herein, it is understood that the pattern for the lower level topmost metal structures 788 may be altered to optimize wiring in the underlying peripheral device region 700 as long as the lower level topmost metal structures 788 provide suitable landing pad areas for the through-memory-level via structures to be subsequently formed.

The exemplary structure can include a memory array region 100, a contact region 300, and an optional peripheral device region 200. An array of memory stack structures can be subsequently formed in the memory array region 100 and over the at least one lower level dielectric layer 120 (if present). Contacts to word lines of the memory stack structures can be subsequently formed in the contact region 300. If present, additional semiconductor devices and/or through-memory-level via structures can be formed in the peripheral device region 200. The semiconductor devices 210 may be present in any, and/or each, of the areas of the memory array region 100, the contact region 300, and the peripheral device region 200. For example, the semiconductor devices 210 may be present in the peripheral device region 200 but not under the memory array region 100 or the contact region 300. The region of the semiconductor devices 210 and the combination of the at least one lower level dielectric layer 120 and the lower level metal interconnect structures embedded therein is herein referred to an underlying peripheral device region, which may be located underneath a memory-level assembly to be subsequently formed and includes peripheral devices for the memory-level assembly.

A layer stack including an optional metallic conductive layer 108, a p-doped source semiconductor layer 112, a lower silicon oxide layer 113, an undoped sacrificial semiconductor layer 114, an upper silicon oxide liner 115, and a p-doped etch stop semiconductor layer 152 can be sequentially formed over the at least one lower level dielectric layer 120 and/or the semiconductor substrate 8.

The optional metallic conductive layer 108 includes a metallic material such as an elemental metal (such as tungsten), an intermetallic alloy of at least two elemental metals, a conductive metal nitride (such as TiN), or a metal silicide (such as cobalt silicide, nickel silicide, or tungsten silicide). The optional metallic conductive layer 108 provides a highly conductive horizontal current path for source electrodes to be subsequently formed. The optional metallic conductive layer 108 can be formed by a conformal deposition method or a non-conformal deposition method, and can have a thickness in a range from 20 nm to 200 nm, although lesser and greater thicknesses can also be employed.

The p-doped source semiconductor layer 112 includes a doped semiconductor material. The dopant (i.e., boron) concentration of the p-doped source semiconductor layer 112 can be in a range from $1.0 \times 10^{19}/cm^3$ to $2.0 \times 10^{21}/cm^3$, although lesser and greater dopant concentrations can also be employed. In one embodiment, the p-doped source semiconductor layer 112 can include p-doped polysilicon, p-doped amorphous silicon that is converted into p-doped polysilicon in a subsequent processing step (such as an anneal process), any other p-doped polycrystalline semiconductor material, or any p-doped amorphous semiconductor material that can be subsequently converted into a polycrystalline semiconductor material. In one embodiment, the p-doped source semiconductor layer 112 can provide holes that are injected into channels of memory stack structures to be subsequently formed. The p-doped source semiconductor layer 112 can be deposited by a conformal deposition method (such as chemical vapor deposition) or a non-conformal deposition method. The thickness of the p-doped source semiconductor layer 112 can be in a range from 30 nm to 600 nm, although lesser and greater thicknesses can also be employed.

The lower silicon oxide layer 113 includes doped silicate glass or undoped silicate glass (i.e., silicon oxide). The lower silicon oxide layer 113 can include thermal oxide formed by thermal oxidation of a surface portion of the p-doped source semiconductor layer 112, or can include a deposited silicon oxide material that may be formed, for example, by thermal decomposition of a silicon oxide precursor gas (such as tetraethylorthosilicate gas). The lower silicon oxide layer 113 can be deposited by a plasma enhanced chemical vapor deposition (PECVD) or low pressure chemical vapor deposition (LPCVD). The thickness of the lower silicon oxide layer 113, as measured at horizontal portions, can be in a range from 10 nm to 50 nm, although lesser and greater thicknesses can also be employed.

The undoped sacrificial semiconductor layer 114 is deposited on the lower silicon oxide layer 113. The undoped sacrificial semiconductor layer 114 includes a semiconductor material that can be removed selective to the lower silicon oxide layer 113 by an etch process. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. For example, the undoped sacrificial semiconductor layer 114 can include amorphous silicon, an amorphous silicon-germanium alloy, or a polycrystalline semiconductor material. The semiconductor material of the undoped sacrificial semiconductor layer 114 is undoped. As used herein, an "undoped" semiconductor material refers to an intrinsic semiconductor material in which p-type dopants and n-type dopants are exactly balanced, or a semiconductor material in which the excess dopants (of p-type or n-type) are at an insignificant atomic concentration such as $1.0 \times 10^{15}/cm^3$ or less. The undoped sacrificial semiconductor layer 114 can be deposited by chemical vapor deposition. The thickness of the undoped sacrificial semiconductor layer 114 can be in a range from 20 nm to 200 nm, although lesser and greater thicknesses can also be employed.

The upper silicon oxide layer 115 includes doped silicate glass or undoped silicate glass (i.e., silicon oxide). The upper silicon oxide layer 115 can include a deposited silicon oxide material that may be formed, for example, by thermal decomposition of a silicon oxide precursor gas (such as tetraethylorthosilicate gas). The upper silicon oxide layer 115 can be deposited by a plasma enhanced chemical vapor deposition (PECVD) or low pressure chemical vapor deposition (LPCVD). The thickness of the upper silicon oxide layer 115, as measured at horizontal portions, can be in a range from 10 nm to 50 nm, although lesser and greater thicknesses can also be employed. The material of the upper silicon oxide layer 115 may be the same as, or may be different from, the material of the lower silicon oxide layer 113.

A p-doped etch stop semiconductor layer 152 can be formed on a top surface of the second silicon oxide layer 115. The p-doped etch stop semiconductor layer 152 can include a semiconductor material layer that can function as an etch stop layer during subsequent etch of the upper silicon oxide layer 115. For example, the p-doped etch stop semiconductor layer 152 can include p-doped amorphous silicon, polysilicon, or a silicon-germanium alloy. The dopant (i.e., boron) concentration of the p-doped etch stop semiconductor layer 152 can be in a range from $1.0 \times 10^{19}/cm^3$ to $2.0 \times 10^{21}/cm^3$, although lesser and greater dopant concentrations can also be employed. The thickness of the p-doped etch stop semiconductor layer 152 can be in a range from 100 nm to 300 nm, although lesser and greater thicknesses can also be employed. The p-doped etch stop semiconductor layer 152 can be subsequently employed as an etch stop layer during formation of memory openings or backside trenches through a first alternating stack of material layers to be subsequently formed.

Figure 2:
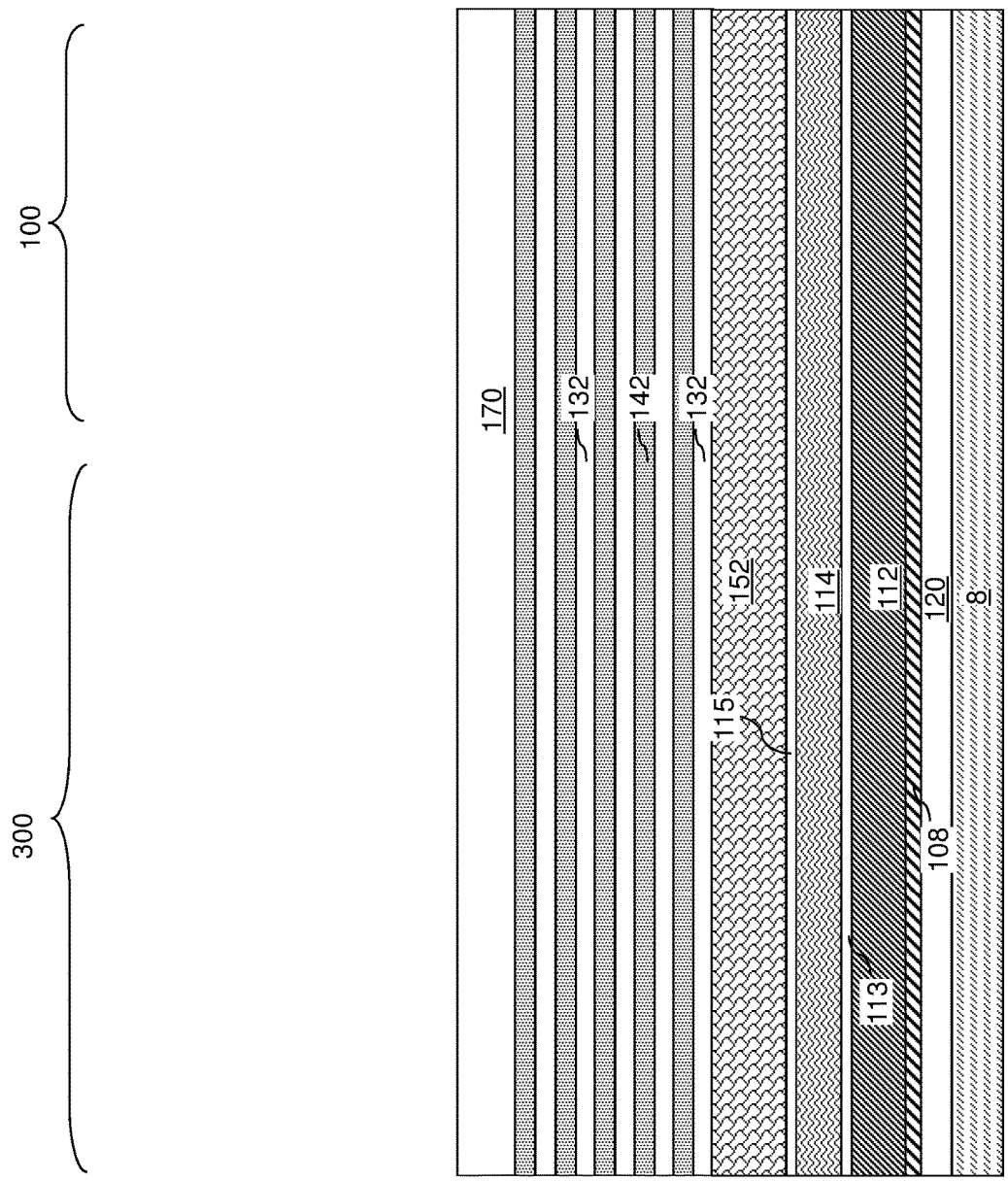
FIG. 2 is a vertical cross-sectional view of the exemplary structure after formation of a first alternating stack of first insulating layers and first sacrificial material layers and a dielectric cap layer according to an embodiment of the present disclosure.

Referring to FIG. 2, a stack of an alternating plurality of first material layers (which can be first insulating layers 132) and second material layers (which can be first sacrificial material layer 142) is formed over the p-doped etch stop semiconductor layer 152. As used herein, a "material layer" refers to a layer including a material throughout the entirety thereof. Instances of the first material layers may have the same thickness thereamongst, or may have different thicknesses. Instances of the second elements may have the same thickness thereamongst, or may have different thicknesses. Each first material layer includes a first material, and each second material layer includes a second material that is different from the first material. In one embodiment, each first material layer can be a first insulating layer 132, and each second material layer can be a first sacrificial material layer 142. In this case, a first alternating stack (132, 142) of the first insulating layers 132 and the first sacrificial material layers 142 can be formed over the p-doped etch stop semiconductor layer 152. The levels of the layers in the first alternating stack (132, 142) are collectively referred to as first-tier levels. The set of all structures formed in the first-tier levels is herein referred to as a first-tier structure.

Thus, the first alternating stack (132, 142) can include the first insulating layers 132 composed of the first material, and the first sacrificial material layers 142 composed of a second material different from that of the first insulating layers 132. The first material of the first insulating layers 132 can be at least one insulating material. Insulating materials that can be employed for the first insulating layers 132 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be spacer material layers that comprise silicon nitride or a semiconductor material including at least one of silicon and germanium.

In one embodiment, the first insulating layers 132 can include silicon oxide, and the first sacrificial material layers 142 can include silicon nitride. The first material of the first insulating layers 132 can be deposited, for example, by chemical vapor deposition (CVD). For example, if silicon oxide is employed for the first insulating layers 132, tetraethyl orthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

Generally, the spacer material layers may be formed as, or may be subsequently replaced with, electrically conductive layers. While the present disclosure is described employing an embodiment in which the spacer material layers are first sacrificial material layers 142 that are subsequently replaced with electrically conductive layers, embodiments are expressly contemplated herein in which the first sacrificial material layers are formed as electrically conductive layers. In this case, steps for replacing the spacer material layers with electrically conductive layers can be omitted.

A first insulating cap layer 170 can be deposited over the first alternating stack (132, 142). The first insulating cap layer 170 includes a material different from the material of the first sacrificial material layers 142, and can include the same material as the first insulating layers 132. For example, the first insulating cap layer 170 can include silicon oxide. The thickness of the first insulating cap layer 170 can be in a range from 30 nm to 500 nm, although lesser and greater thicknesses can also be employed. In one embodiment, the thickness of the first insulating cap layer 170 can be at least twice the thickness of the first insulating layers 132.

Figure 3:
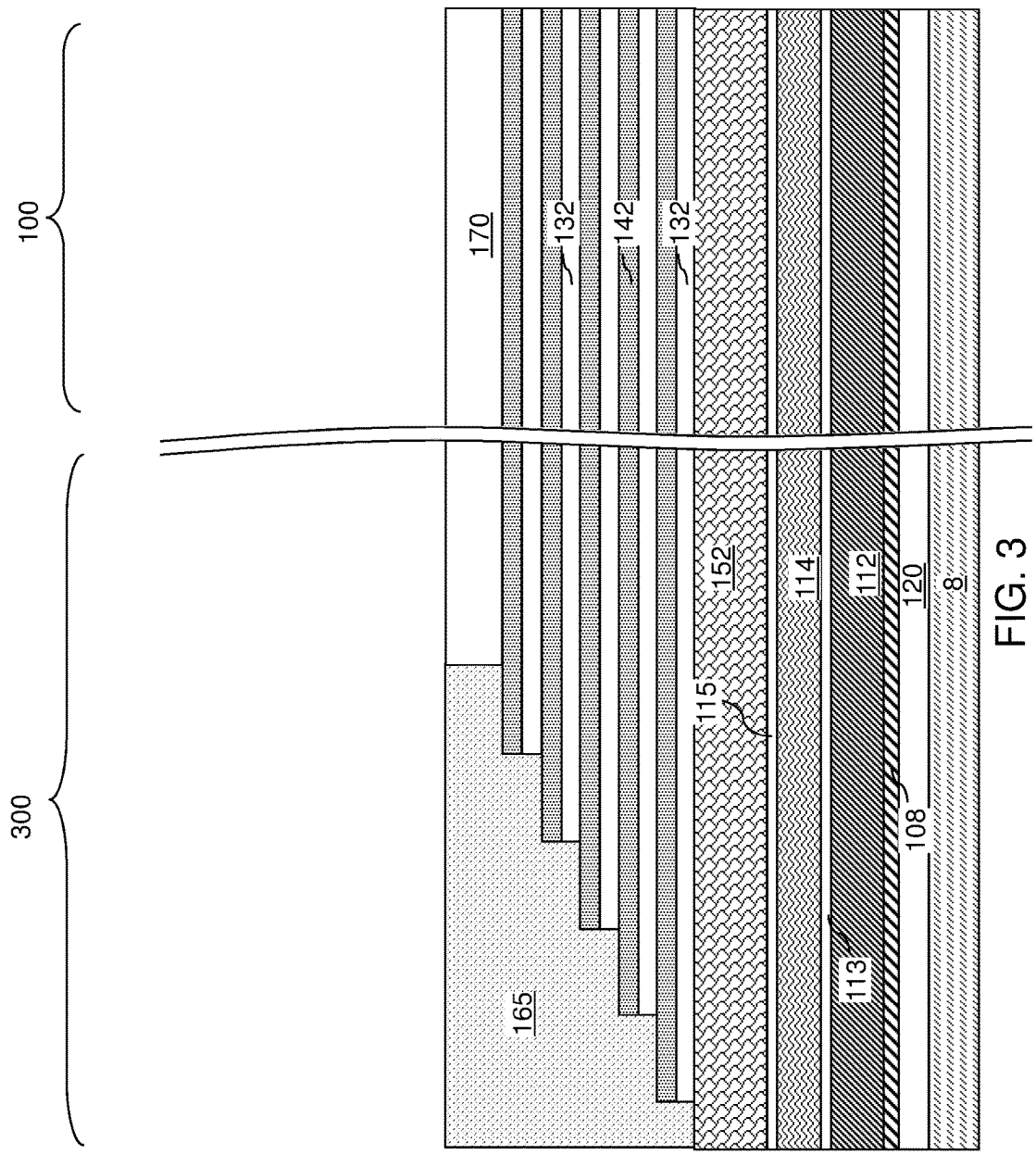
FIG. 3 is a vertical cross-sectional view of the exemplary structure after formation of first stepped surfaces and a first retro-stepped dielectric material portion according to an embodiment of the present disclosure.
Figure 4B:
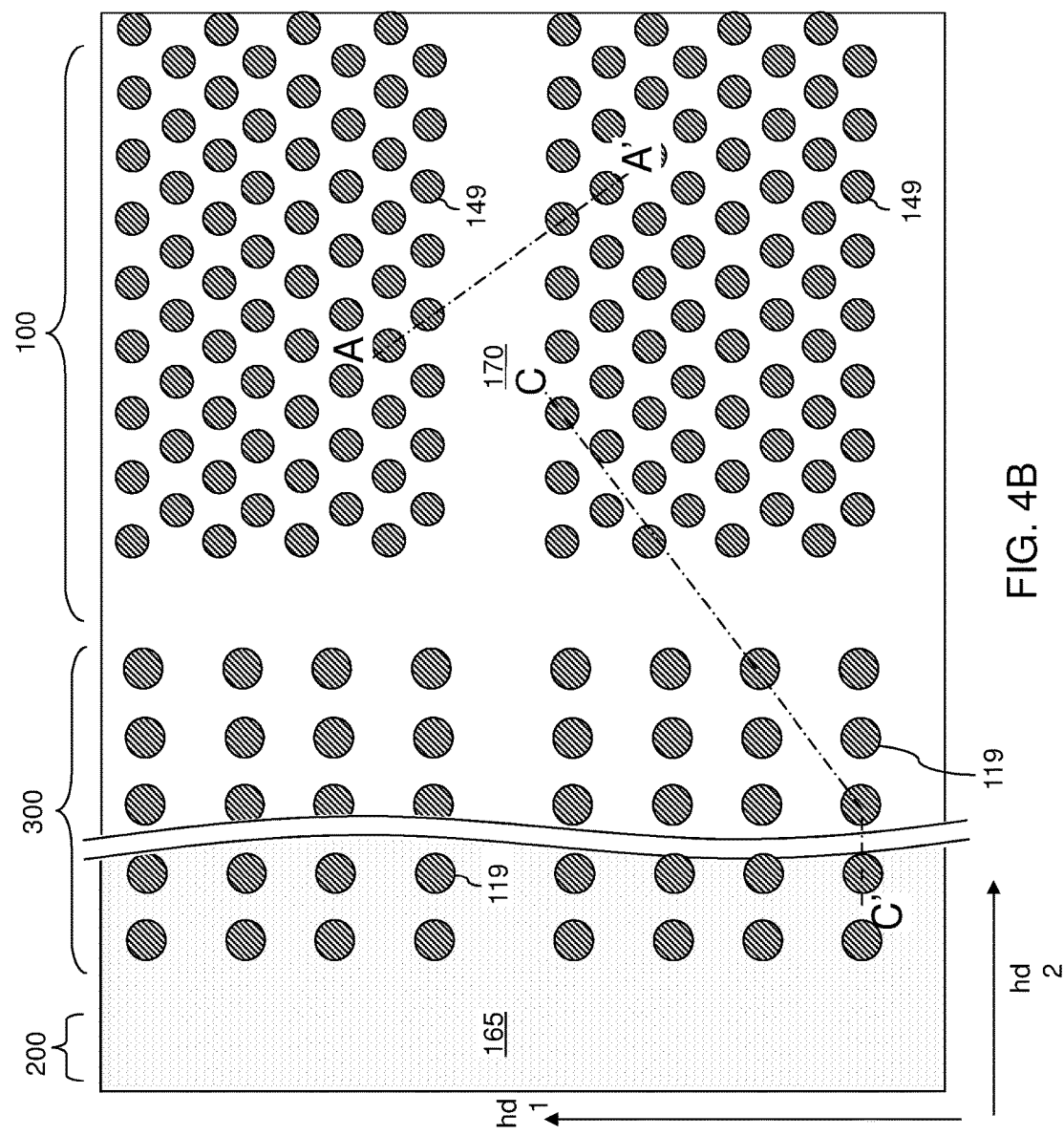
FIG. 4B is a top-down view of the exemplary structure of FIG. 4A. The plane A-A' is the plane of the vertical cross-section of FIG. 4A.
Figure 4C:
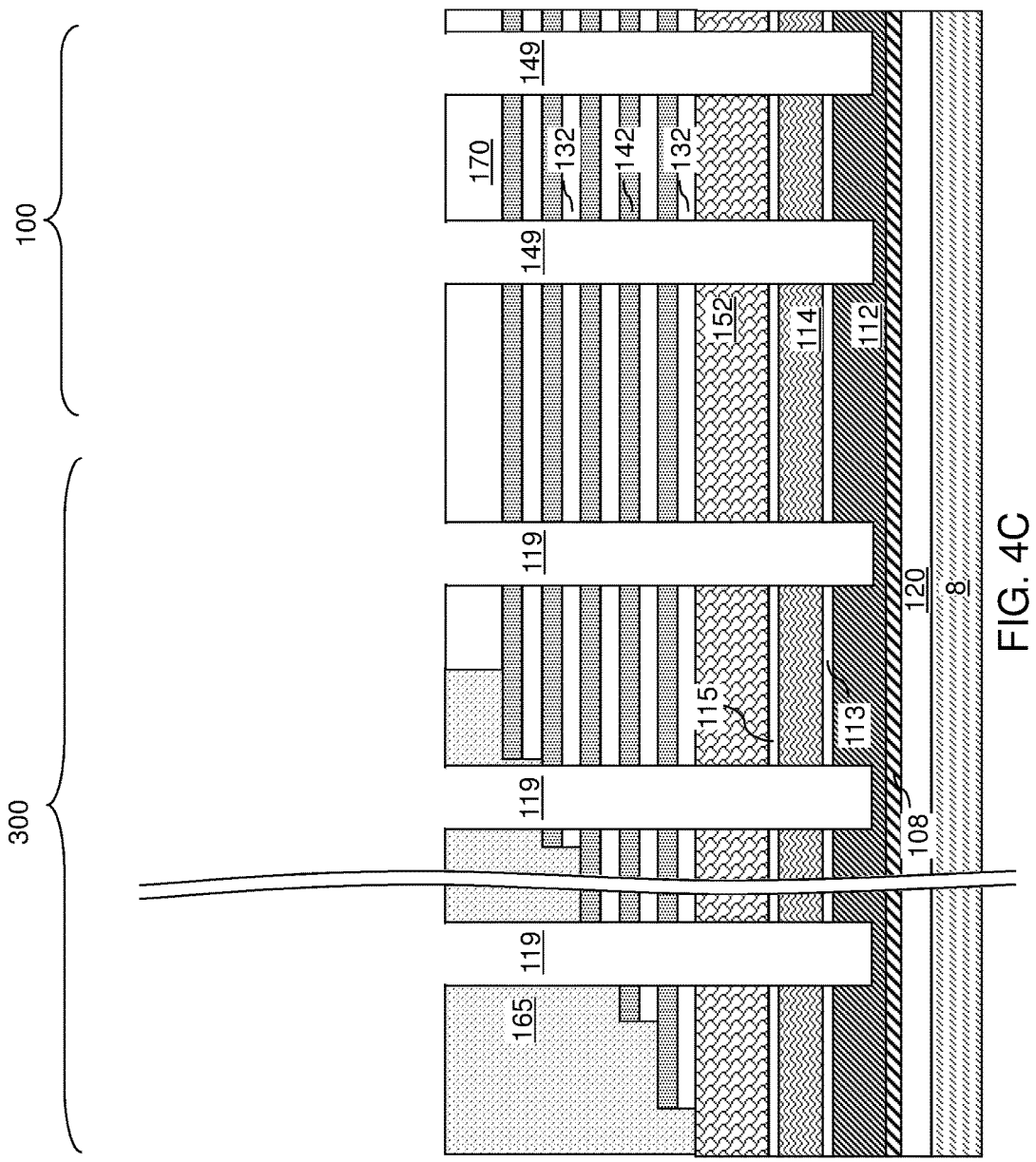
FIG. 4C is another vertical cross-sectional view of the exemplary structure along the vertical plane C-C' of FIG. 4B.

Referring to FIG. 3, a stepped cavity can be formed within the contact region 300 which is located between the memory array region 100 (e.g., memory plane) and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the semiconductor substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure. The layers within the first alternating stack (132, 142) are patterned with different lateral extent that decreases with a vertical distance from the semiconductor substrate 8.

A peripheral portion of the first alternating stack (132, 142) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the first alternating stack (132, 142). Each first sacrificial material layer 142 other than a topmost first sacrificial material layer 142 within the first alternating stack (132, 142) laterally extends farther than any overlying first sacrificial material layer 142 within the first alternating stack (132, 142). The terrace region includes stepped surfaces of the first alternating stack (132, 142) that continuously extend from a bottommost layer within the first alternating stack (132, 142) to a topmost layer within the first alternating stack (132, 142).

A first retro-stepped dielectric material portion 165 (i.e., an insulating fill material portion) can be formed on the stepped surfaces of the first alternating stack (132, 142) in the stepped cavity by deposition of a dielectric material therein. For example, a dielectric material such as silicon oxide can be deposited in the stepped cavity. Excess portions of the deposited dielectric material can be removed from above the top surface of the first alternating stack (132, 142), for example, by chemical mechanical planarization (CMP). The remaining portion of the deposited dielectric material filling the stepped cavity constitutes the first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. If silicon oxide is employed for the first retro-stepped dielectric material portion 165, the silicon oxide of the first retro-stepped dielectric material portion 165 may, or may not, be doped with dopants such as B, P, and/or F.

Referring to FIGS. 4A-4D, a lithographic material stack (not shown) including at least a photoresist layer can be formed over the first alternating stack (132, 142) and the first retro-stepped dielectric material portion 165, and can be lithographically patterned to form openings therein. The openings include a first set of openings formed over the memory array region 100 and a second set of openings formed over the contact region 300. The pattern in the lithographic material stack can be transferred through the first retro-stepped dielectric material portion 165 and through the first alternating stack (132, 142) by at least one anisotropic etch that employs the patterned lithographic material stack as an etch mask. Portions of the first alternating stack (132, 142) underlying the openings in the patterned lithographic material stack are etched to form first memory openings 149 and first support openings 119. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The first memory openings 149 are formed through the entirety of the first alternating stack (132, 142) in the memory array region 100. The first support openings 119 are formed through the first retro-stepped dielectric material portion 165 and the portion of the first alternating stack (132, 142) that underlie the stepped surfaces in the contact region 300.

The first memory openings 149 extend through the entirety of the first alternating stack (132, 142), the p-doped etch stop semiconductor layer 152, and the undoped sacrificial semiconductor layer 114, and into an upper portion of the p-doped source semiconductor layer 112. The first support openings 119 extend through the first retro-stepped dielectric material portion 165, a subset of layers within the first alternating stack (132, 142), the p-doped etch stop semiconductor layer 152, and the undoped sacrificial semiconductor layer 114, and into an upper portion of the p-doped source semiconductor layer 112. The chemistry of the anisotropic etch process employed to etch through the materials of the first alternating stack (132, 142) can alternate to optimize etching of the first and second materials in the first alternating stack (132, 142). The anisotropic etch can be, for example, a series of reactive ion etches. The sidewalls of the first memory openings 149 and the first support openings 119 can be substantially vertical, or can be tapered. The patterned lithographic material stack can be subsequently removed, for example, by ashing.

Each of the first memory openings 149 and the first support openings 119 may have vertical sidewalls or tapered sidewalls. A two-dimensional array of first memory openings 149 can be formed in the memory array region 100. A two-dimensional array of first support openings 119 can be formed in the contact region 300.

The p-doped etch stop semiconductor layer 152 can be employed as an etch stop structure during the anisotropic etch process that forms the first memory openings 149 and the first support openings 119. Subsequently, the chemistry of the anisotropic etch process can be changed to etch the material of the p-doped etch stop semiconductor layer 152 selective to the material of the upper silicon oxide liner 115, i.e., silicon oxide. The chemistry of the anisotropic etch process can be changed to etch through the upper silicon oxide liner 115, and then to etch the material of the undoped sacrificial semiconductor layer 114 selective to the material of the lower silicon oxide liner 113, i.e., silicon oxide. Thereafter, the chemistry of the anisotropic etch process can be changed to etch through the lower silicon oxide liner 113, and then to etch the upper portion of the p-doped source semiconductor layer 112.

Sidewalls of the bottommost layer of the first alternating stack (132, 142) (such as the bottommost first insulating layer 132), the p-doped etch stop semiconductor layer 152, the upper silicon oxide liner 115, the undoped sacrificial semiconductor layer 114, the lower silicon oxide liner 113, and the p-doped source semiconductor layer 112 are physically exposed around each first memory opening 149 and around each first support opening 119. Further, the sidewalls of the bottommost layer of the first alternating stack (132, 142) (such as the bottommost first insulating layer 132), the p-doped etch stop semiconductor layer 152, the upper silicon oxide liner 115, the undoped sacrificial semiconductor layer 114, the lower silicon oxide liner 113, and the p-doped source semiconductor layer 112 can be vertically coincident around each first memory opening 149 and around each first support opening 119. As used herein, a first sidewall and a second sidewall are "vertically coincident" if the second sidewall overlies or underlies the first sidewall and if there exists a vertical plane including the first sidewall and the second sidewall.

Subsequently, an oxidation process can be performed to convert surface portions of the p-doped etch stop semiconductor layer 152, the undoped sacrificial semiconductor layer 114, and the p-doped source semiconductor layer 112 into respective semiconductor oxide portions. Referring to FIG. 5, a vertical cross-sectional view of a bottom portion of a first memory opening 149 is illustrated after the oxidation process, which may include a thermal oxidation process and/or a plasma oxidation process. In one embodiment, each of the p-doped etch stop semiconductor layer 152, the undoped sacrificial semiconductor layer 114, and the p-doped source semiconductor layer 112 can include polycrystalline silicon or amorphous silicon. In this case, the oxidation process converts each physically exposed surface portion of the p-doped source semiconductor layer 112 around a first memory opening 149 or a first support opening 119 into a silicon oxide cap 512, each physically exposed surface portion of the p-doped etch stop semiconductor layer 152 into a first silicon oxide ring 516, and each physically exposed surface portion of the undoped sacrificial semiconductor layer 114 around a first memory opening 149 or a first support opening 119 into a second silicon oxide ring 514.

If boron atoms are employed as the p-type dopants in the p-doped source semiconductor layer 112 and the p-doped etch stop semiconductor layer 152, the boron atoms increase the oxidation of the boron-doped silicon material with respect to the oxidation rate of undoped silicon material having a comparable crystalline structure. The increase in the oxidation rate in heavily boron-doped silicon material relative to the oxidation rate in undoped silicon material of the same crystallinity may be in a range from a factor of 1.5 to a factor of 3. In this case, each second silicon oxide ring 514 can have a lesser thickness than the first silicon oxide rings 516 and the silicon oxide caps 512. Each silicon oxide cap 512 can have a horizontal portion and a vertical cylindrical portion that adjoins the periphery of the horizontal portion. The duration of the oxidation process may be selected such that each second silicon oxide ring 514 adjoins a top portion of an underlying silicon oxide cap 512 and a bottom portion of an overlying first silicon oxide ring 516. The thickness of the vertical portions and horizontal portions of each silicon oxide cap 512 can be the same, and can be in a range from 3 nm to 10 nm, although lesser and greater thicknesses can also be employed. The thickness of the first silicon oxide rings 516 can be in a range from 3 nm to 10 nm, although lesser and greater thicknesses can also be employed. The thickness of the second silicon oxide rings 514 can be in a range from 1.5 nm to 6 nm, although lesser and greater thicknesses can also be employed.

Figure 6:
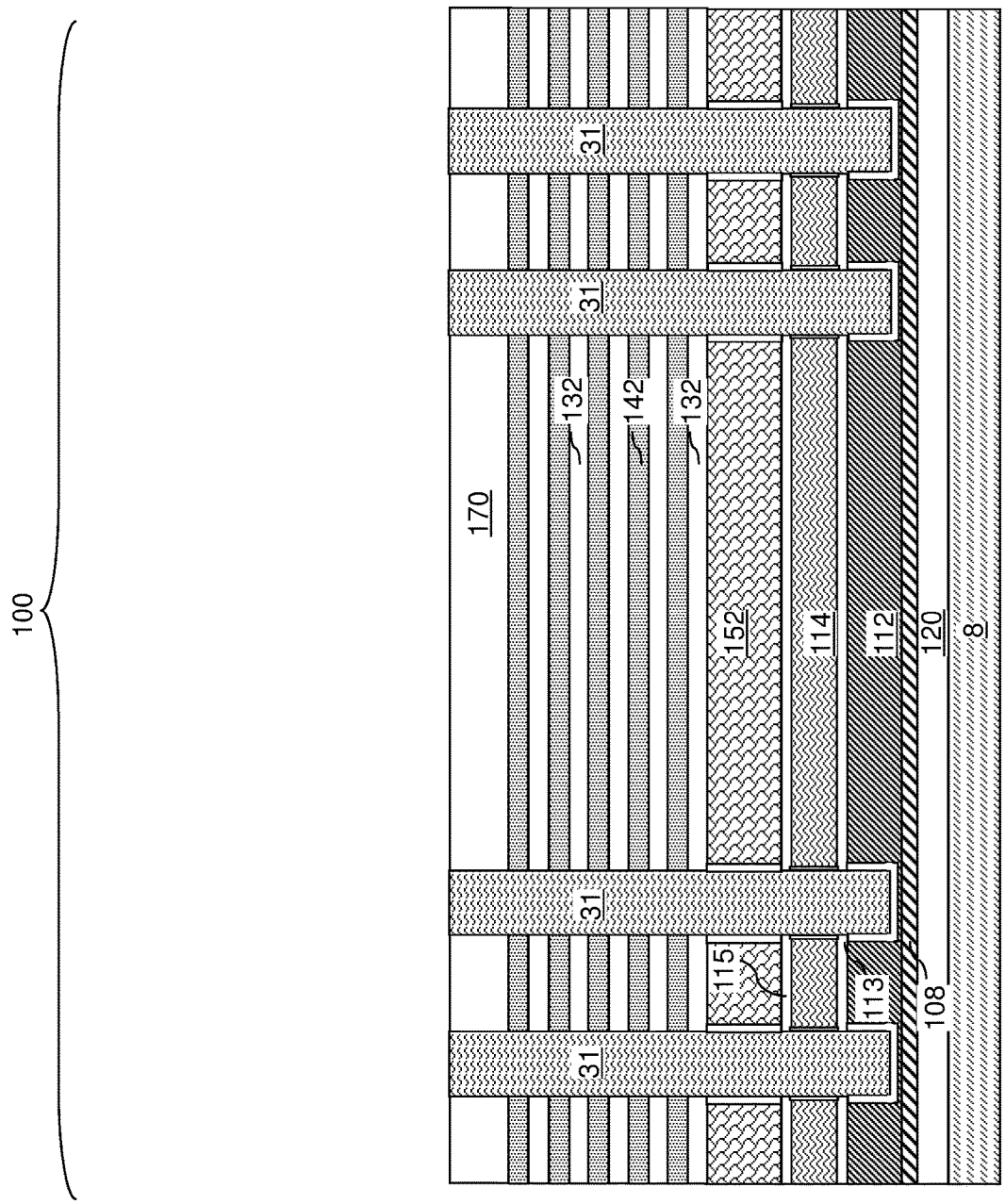
FIG. 6 is a vertical cross-sectional view of a memory array region of the exemplary structure after sacrificial memory opening fill structures according to an embodiment of the present disclosure.

Referring to FIG. 6, a sacrificial material such as amorphous silicon is deposited in the first memory openings 149 and the first support openings 119 by a conformal deposition process such as chemical vapor deposition. Excess portions of the sacrificial can be removed from above the horizontal plane including the top surfaces of the first insulating cap layer 170 and the first retro-stepped dielectric material portion 165 by a planarization process. The planarization process can employ at least one of a recess etch and chemical mechanical planarization. Each remaining portion of the sacrificial material in the first memory openings 149 constitutes a sacrificial memory opening fill structure 31. Each remaining portion of the sacrificial material in the first support openings 119 constitutes a sacrificial support opening fill structure 131 as shown in FIG. 7C.

Figure 7A:
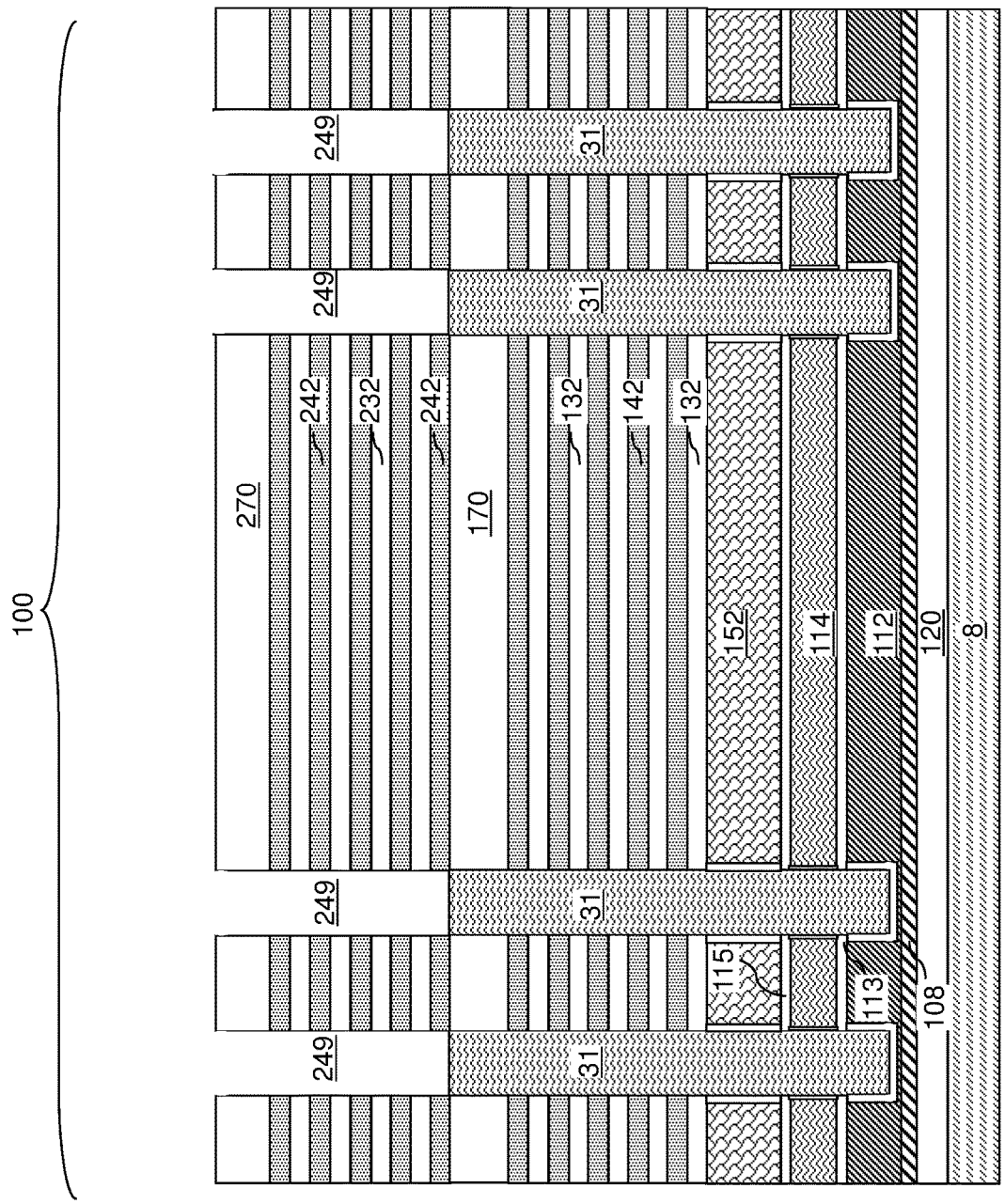
FIG. 7A is a vertical cross-sectional view of the exemplary structure after formation of a second alternating stack of second insulating layers and second sacrificial material layers, second stepped surfaces, a second retro-stepped dielectric material portion, second memory openings, and second support openings according to an embodiment of the present disclosure.
Figure 7B:
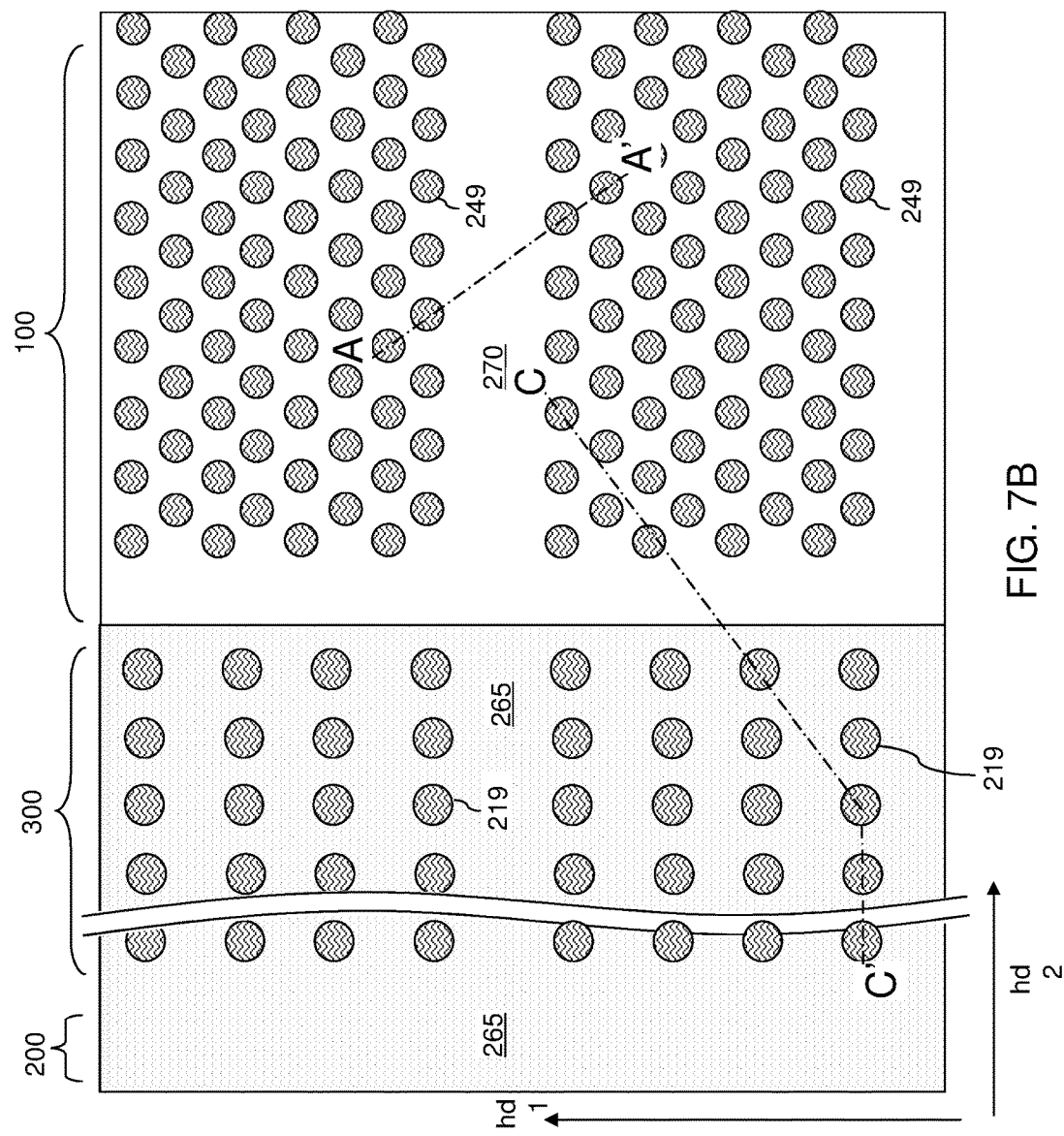
FIG. 7B is a top-down view of the exemplary structure of FIG. 7A. The plane A-A' is the plane of the vertical cross-section of FIG. 7A.
Figure 7C:
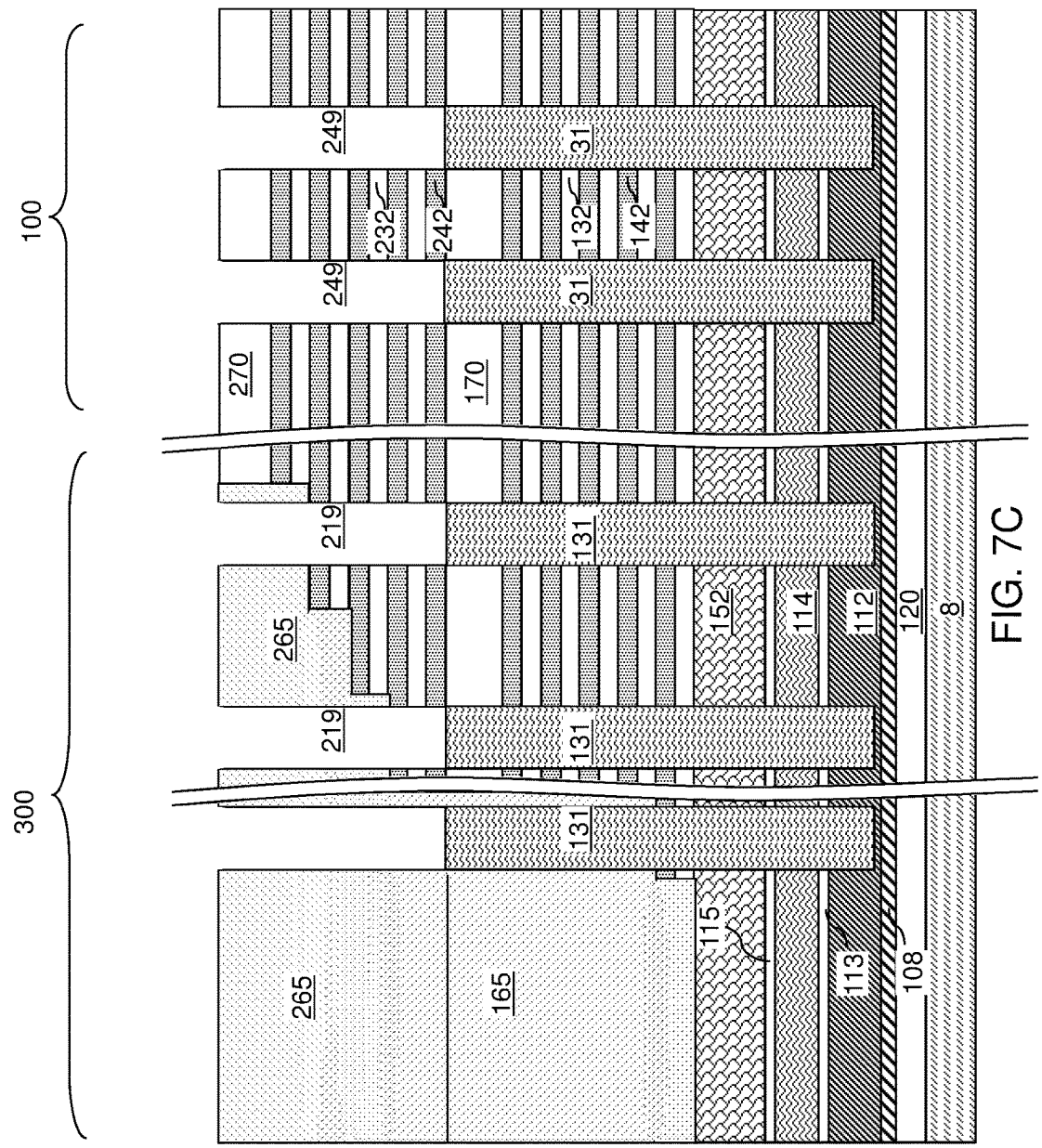
FIG. 7C is another vertical cross-sectional view of the exemplary structure along the vertical plane C-C' of FIG. 7B.

Referring to FIGS. 7A-7C, a second alternating stack (232, 242) of second insulating layers 232 and second sacrificial material layers 242 can be formed The levels of the layers in the second alternating stack (232, 242) are collectively referred to as second-tier levels. The set of all structures formed in the second-tier levels is herein referred to as a second-tier structure.

The second insulating layers 232 can include the same material as the first insulating layers 132. The second sacrificial material layers 242 can include the same material as the first sacrificial material layers 142. In one embodiment, the first and second insulating layers (132, 232) can include silicon oxide, and the first and second sacrificial material layers (142, 242) can include silicon nitride. The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second alternating stack (232, 242) can have a uniform thickness that is substantially invariant within each respective second sacrificial material layer 242.

As in the case of the first alternating stack (132, 142), the spacer material layers of the second alternating stack may be formed as, or may be subsequently replaced with, electrically conductive layers. While the present disclosure is described employing an embodiment in which the spacer material layers are the second sacrificial material layers 242 that are subsequently replaced with electrically conductive layers, embodiments are expressly contemplated herein in which the second sacrificial material layers are formed as electrically conductive layers. In this case, steps for replacing the spacer material layers of the second alternating stack with electrically conductive layers can be omitted.

A second insulating cap layer 270 can be deposited over the second alternating stack (232, 242). The second insulating cap layer 270 includes a material different from the material of the first and second sacrificial material layers (142, 242), and can include the same material as the first and second insulating layers (132, 232). For example, the second insulating cap layer 270 can include silicon oxide. The thickness of the second insulating cap layer 270 can be in a range from 30 nm to 500 nm, although lesser and greater thicknesses can also be employed.

A stepped cavity can be formed within the contact region 300. The stepped cavity can have various stepped surfaces such that the horizontal cross-sectional shape of the stepped cavity changes in steps as a function of the vertical distance from the top surface of the semiconductor substrate 8. The layers within the first alternating stack (132, 142) are patterned with different lateral extent that decreases with a vertical distance from the semiconductor substrate 8. Formation of the stepped cavity through the second alternating stack (232, 242) can be performed in the same manner as formation of the stepped cavity through the first alternating stack (132, 142). The stepped surfaces of the stepped cavity through the second alternating stack (232, 242) can be laterally shifted toward the memory array region 100 such that areas of the stepped surfaces on the second alternating stack (232, 242) does not overlap with the areas of the stepped surfaces on the first alternating stack (132, 142). This configuration allows subsequent formation of word line contact via structures to each level of the sacrificial material layers (142, 242).

A peripheral portion of the second alternating stack (232, 242) can have stepped surfaces after formation of the stepped cavity. A terrace region is formed by patterning the second alternating stack (232, 242). Each second sacrificial material layer 242 other than a topmost second sacrificial material layer 242 within the second alternating stack (232, 242) laterally extends farther than any overlying second sacrificial material layer 242 within the second alternating stack (232, 242). The terrace region includes stepped surfaces of the second alternating stack (232, 242) that continuously extend from a bottommost layer within the second alternating stack (232, 242) to a topmost layer within the second alternating stack (232, 242).

A second retro-stepped dielectric material portion 265 (i.e., an insulating fill material portion) can be formed on the stepped surfaces of the second alternating stack (232, 242) in the stepped cavity by deposition of a dielectric material therein. For example, a dielectric material such as silicon oxide can be deposited in the stepped cavity. Excess portions of the deposited dielectric material can be removed from above the top surface of the second alternating stack (232, 242), for example, by chemical mechanical planarization (CMP). The remaining portion of the deposited dielectric material filling the stepped cavity constitutes the second retro-stepped dielectric material portion 265. If silicon oxide is employed for the second retro-stepped dielectric material portion 265, the silicon oxide of the second retro-stepped dielectric material portion 265 may, or may not, be doped with dopants such as B, P, and/or F.

A lithographic material stack (not shown) including at least a photoresist layer can be formed over the second alternating stack (232, 242) and the second retro-stepped dielectric material portion 265, and can be lithographically patterned to form openings therein. The pattern of the openings through the lithographic material stack can be the same as the pattern of the sacrificial memory opening fill structures 31 and the sacrificial support opening fill structures 131. As such, the lithographic mask employed to pattern the first memory openings 149 and the first support openings 119 can be employed to pattern the lithographic material stack.

The pattern in the lithographic material stack can be transferred through the second retro-stepped dielectric material portion 265 and through the second alternating stack (232, 242) by at least one anisotropic etch that employs the patterned lithographic material stack as an etch mask. Portions of the second alternating stack (232, 242) underlying the openings in the patterned lithographic material stack are etched to form second memory openings 249 and second support openings 219. The second memory openings 249 are formed through the entirety of the second alternating stack (232, 242) in the memory array region 100. The second support openings 219 are formed through the second retro-stepped dielectric material portion 265 and the portion of the second alternating stack (232, 242) that underlie the stepped surfaces in the contact region 300.

Each second memory opening 249 can be formed directly on a respective one of the sacrificial memory opening fill structures 31. Each second support opening 219 can be formed on a respective one of the sacrificial support opening fill structures 131.

Figure 8:
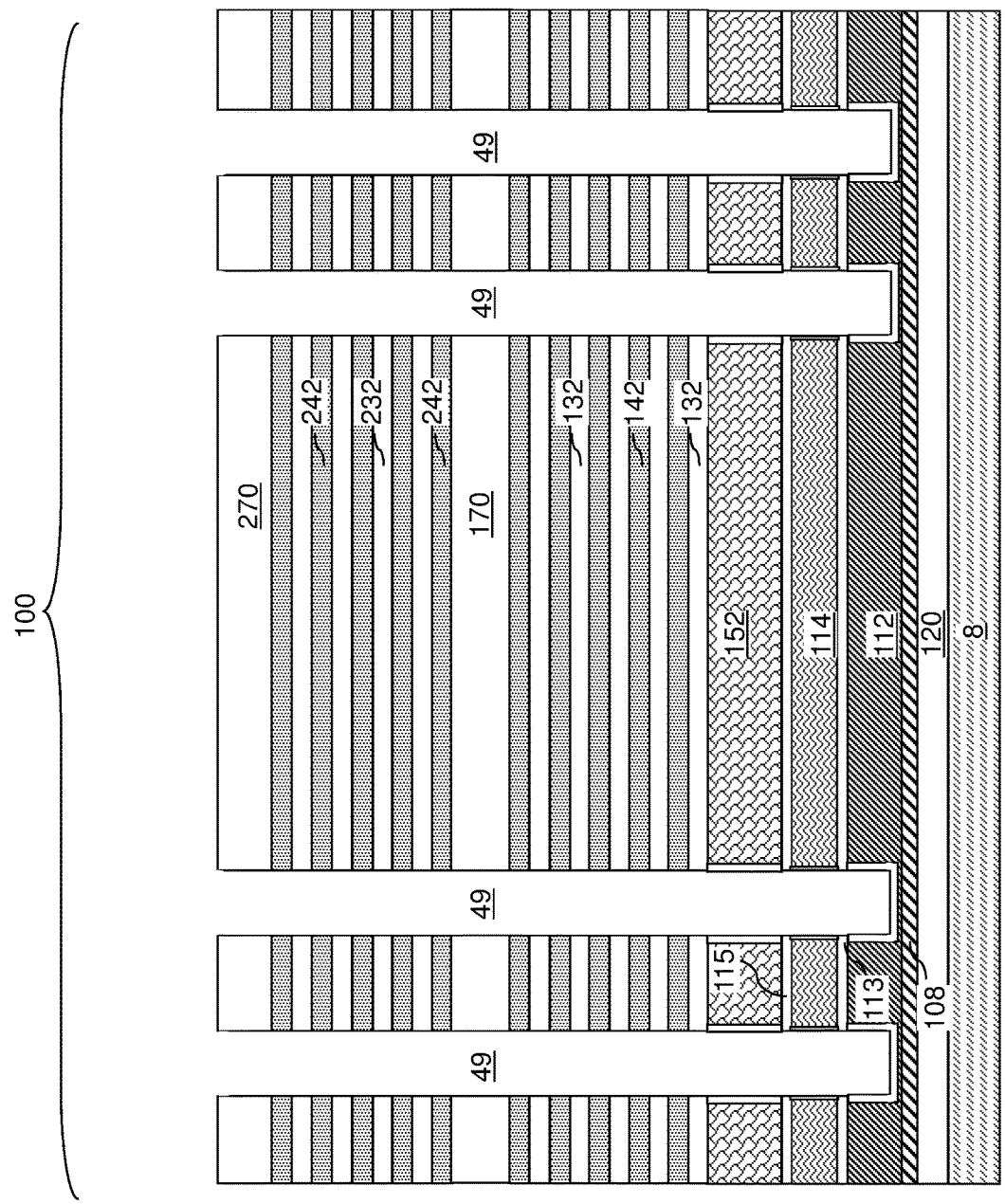
FIG. 8 is a vertical cross-sectional view of a memory array region of the exemplary structure after formation of inter-tier memory openings according to an embodiment of the present disclosure.

Referring to FIG. 8, the sacrificial memory opening fill structures 31 and the sacrificial support opening fill structures 131 can be removed by an etch process that etches the material of the sacrificial memory opening fill structures 31 and the sacrificial support opening fill structures 131 selective to the materials of the first and second insulating layers (132, 232), the first and second sacrificial material layers (142, 242), the silicon oxide caps 512, the first silicon oxide rings 516, and the second silicon oxide rings 514. For example, a wet etch employing a trimethyl-2 hydroxyethyl ammonium hydroxide (TMY) or KOH solution or an anisotropic etch that removes amorphous silicon selective to silicon oxide can be employed.

Due to the finite selectivity of the etch process employed to etch the material of the sacrificial memory opening fill structures 31 and the sacrificial support opening fill structures 131 relative to silicon oxide, surface portions of the silicon oxide caps 512, the first silicon oxide rings 516, and the second silicon oxide rings 514 can be collaterally etched. Thus, each of the silicon oxide caps 512, the first silicon oxide rings 516, and the second silicon oxide rings 514 can be thinned by a same collateral etch distance during the etch process that removes the material of the sacrificial memory opening fill structures 31 and the sacrificial support opening fill structures 131. In addition, the first and second insulating layers (132, 232) may be collaterally recessed during the etch process that removes the material of the sacrificial memory opening fill structures 31 and the sacrificial support opening fill structures 131. After the collateral thinning by the etch process, the thickness of the vertical portions and horizontal portions of each silicon oxide cap 512 can be the same, and can be in a range from 1.5 nm to 8 nm, although lesser and greater thicknesses can also be employed. The thickness of the first silicon oxide rings 516 can be in a range from 1.5 nm to 8 nm, although lesser and greater thicknesses can also be employed. The thickness of the second silicon oxide rings 514 can be in a range from 1.0 nm to 5 nm, although lesser and greater thicknesses can also be employed.

Each combination of the volume of a second memory opening 249 and an underlying first memory opening 149 from which a sacrificial memory opening fill structure 31 is removed defines a memory opening, which is herein referred to as an inter-tier memory opening 49. Each combination of the volume of a second support opening 219 and an underlying first support opening 119 from which a sacrificial support opening fill structure 131 is removed defines a support opening, which is herein referred to as an inter-tier support opening.

Figure 9:
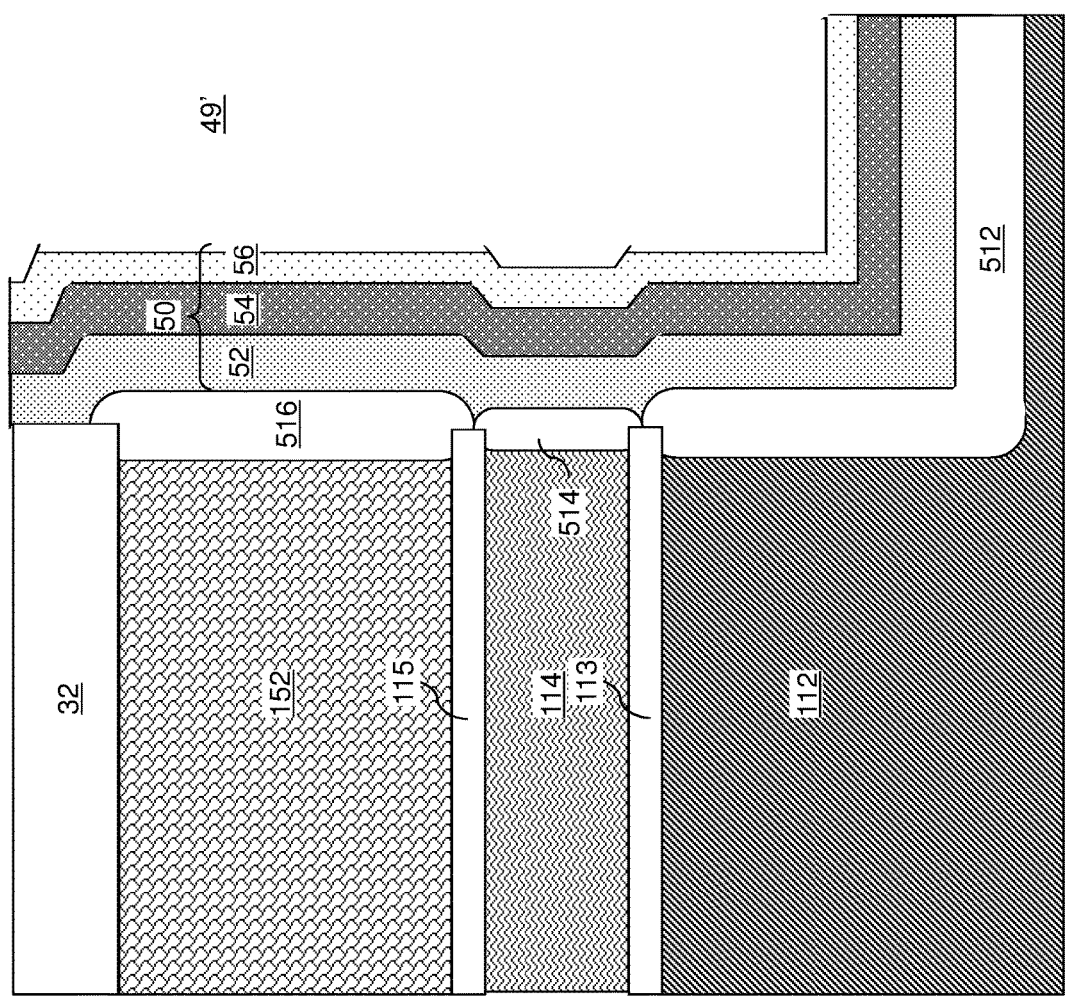
FIG. 9 is a vertical cross-sectional view of a bottom corner of an inter-tier memory opening after formation of a memory film according to an embodiment of the present disclosure.

Referring to FIG. 9, each of the inter-tier memory openings 49 and the inter-tier support openings is filled with a same set of material portions that is deposited by a same set of processing steps. Each set of material portions that fills an inter-tier memory opening 49 is herein referred to as a memory opening fill structure 58 shown in FIG. 10A. Each set of material portions that fills a inter-tier support opening 19 is herein referred to as a support pillar structure, which has a pillar shape and provides structural support to the exemplary structure during subsequent processing steps. Specifically, a stack of layers including a blocking dielectric layer 52, a charge storage layer 54, and a tunneling dielectric layer 56 can be sequentially deposited in each of the inter-tier memory openings 49 and the inter-tier support openings 19. While FIG. 9 illustrates inter-tier memory openings 49 and structures formed therein, it is understood that the same, or similar (in case the inter-tier support openings 19 have different sizes than the inter-tier memory openings 49) structures are formed in each of the inter-tier support openings 19.

The blocking dielectric layer 52 can include a single dielectric material layer or a stack of a plurality of dielectric material layers. In one embodiment, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into first sacrificial material layers 142. In one embodiment, the charge storage layer 54 includes a silicon nitride layer. In one embodiment, the first sacrificial material layers 142 and the first insulating layers 132 can have vertically coincident sidewalls, and the charge storage layer 54 can be formed as a single continuous layer.

In another embodiment, the first sacrificial material layers 142 can be laterally recessed with respect to the sidewalls of the first insulating layers 132, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The combination of the blocking dielectric layer 52, the charge storage layer 54, and the tunneling dielectric layer 56 is herein referred to as a memory film 50.

Figure 10A:
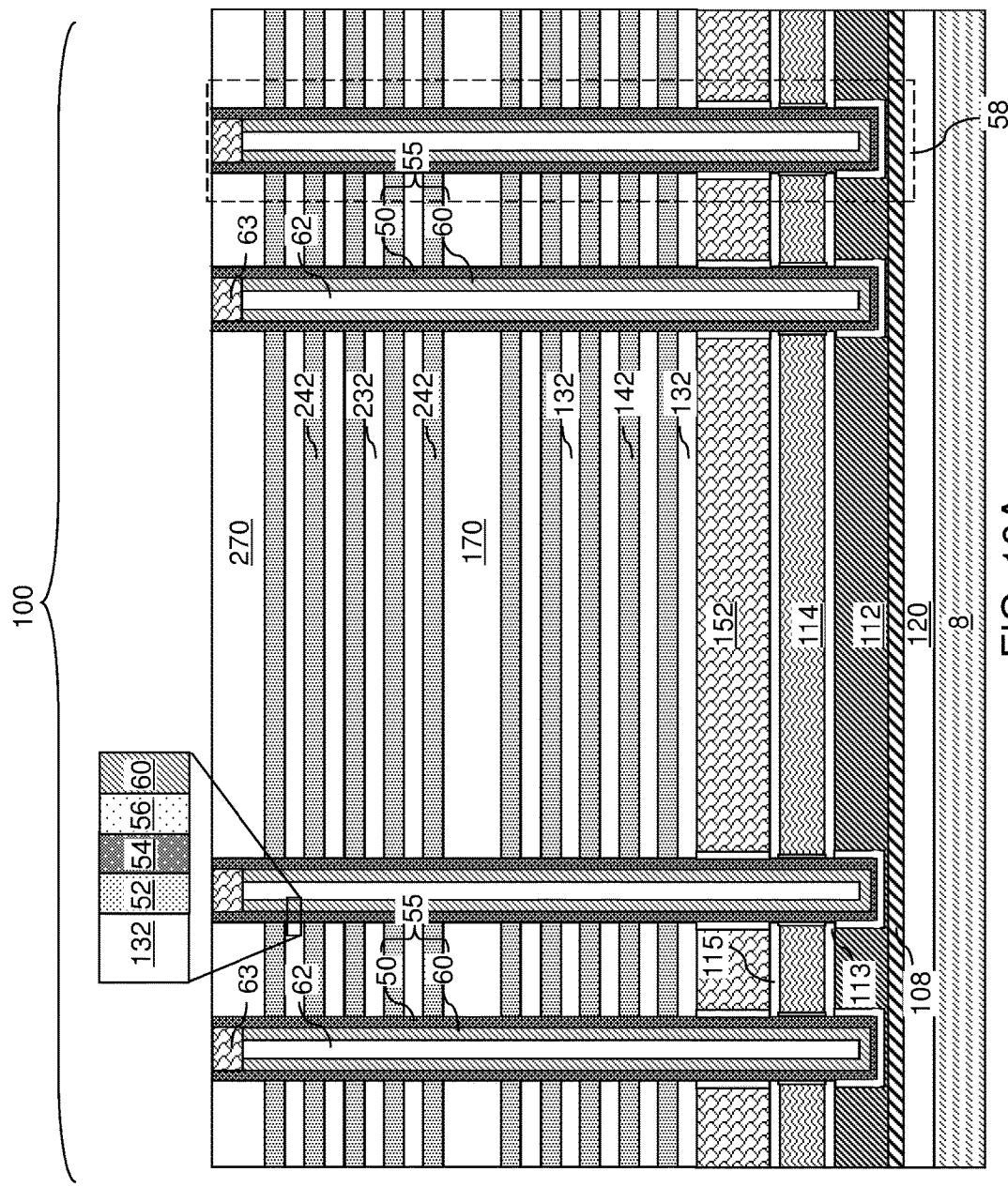
FIG. 10A is a vertical cross-sectional view of the exemplary structure after formation of a memory stack structure, a dielectric core, and an n-doped region within each inter-tier memory opening according to an embodiment of the present disclosure.
Figure 10B:
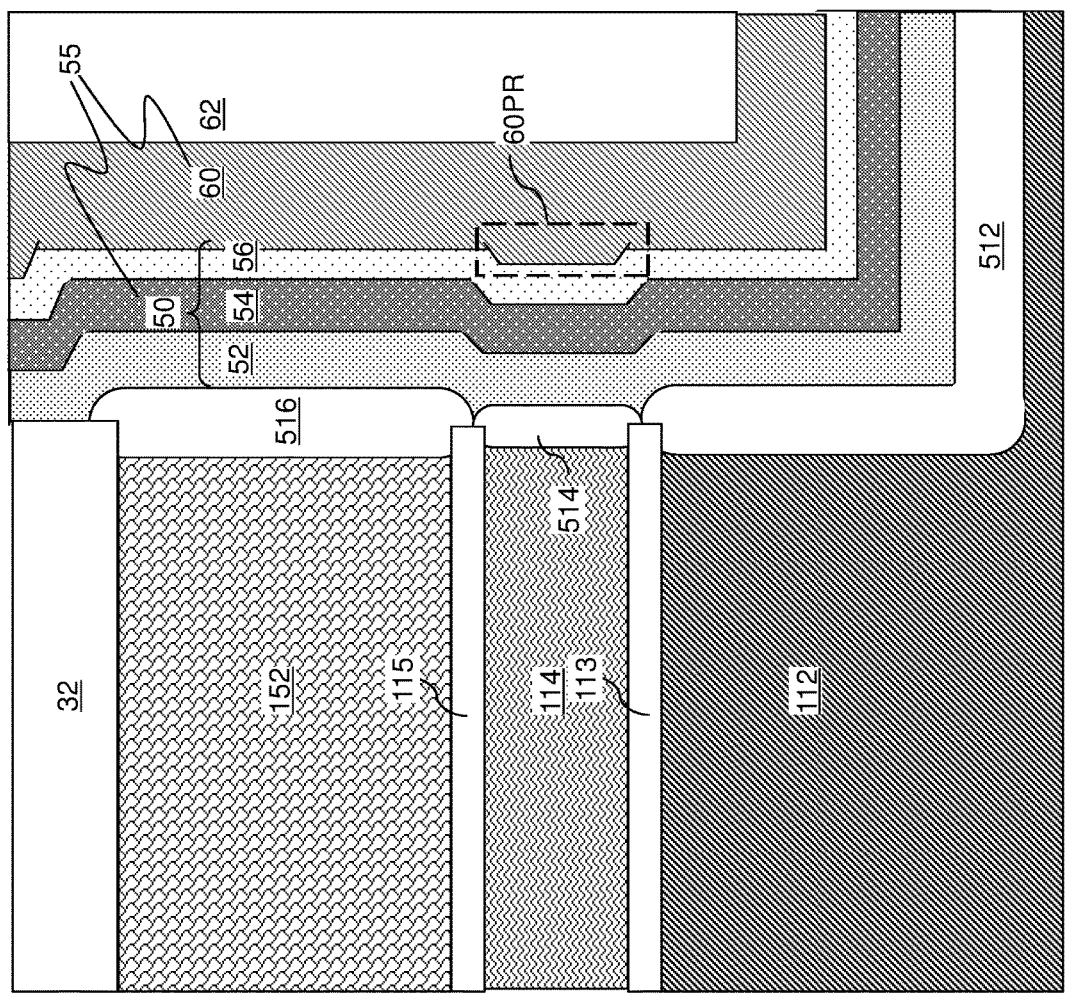
FIG. 10B is a vertical cross-sectional view of a bottom corner of an inter-tier memory opening at the processing step of FIG. 10A.

Referring to FIGS. 10A and 10B, a p-doped semiconductor channel layer is deposited on the memory film within each inter-tier memory opening 49 and within each inter-tier support opening. The p-doped semiconductor channel layer includes a p-doped semiconductor material that is employed to form semiconductor channels 60. The p-doped semiconductor channel layer includes at least one semiconductor material that may include at least one elemental semiconductor material, at least one III-V compound semiconductor material, at least one II-VI compound semiconductor material, at least one organic semiconductor material, or other semiconductor materials known in the art. In one embodiment, the p-doped semiconductor channel layer includes amorphous silicon or polysilicon. The p-doped semiconductor channel layer can be formed by a conformal deposition method such as low pressure chemical vapor deposition (LPCVD) with in-situ doping. Thus, the p-doped semiconductor channel layer can be formed with a laterally protruding ring that protrudes outward at a level of the second silicon oxide rings 514.

The dopant (e.g., boron) concentration in the p-doped semiconductor channel layer can be in a range from $1.0 \times 10^{15}/cm^3$ to $1.0 \times 10^{18}/cm^3$, such as from $1.0 \times 10^{16}/cm^3$ to $3.0 \times 10^{17}/cm^3$, although lower and higher dopant concentrations can also be employed. The thickness of the semiconductor channel layer can be in a range from 2 nm to 10 nm, although lesser and greater thicknesses can also be employed. A memory cavity may be present in the volume of each inter-tier memory opening 49 that is not filled with the deposited material layers (52, 54, 56, 60).

A dielectric fill material can be deposited to fill the memory cavities (i.e., unfilled volumes) within the inter-tier memory openings 49 and the inter-tier support openings. The dielectric fill material can include, for example, silicon oxide or organosilicate glass. The material can be deposited by a conformal deposition method such as low pressure chemical vapor deposition (LPCVD), or by a self-planarizing deposition process such as spin coating. The dielectric fill material and the memory film 50 can be removed from above the top surface of the second insulating cap layer 270 by a planarization process, which can include a recess etch process and/or chemical mechanical planarization (CMP) process. A remaining portion of the memory film 50 is present within each inter-tier memory opening 49. A remaining portion of the semiconductor channel layer is present within each inter-tier memory opening 49 and constitutes a semiconductor channel 60, as shown in FIG. 10B. Each p-doped vertical semiconductor channel 60 can be formed with a laterally protruding ring 60PR that protrudes outward at a level of the second silicon oxide rings 514. A remaining portion of the dielectric fill material is present within each inter-tier memory opening 49, and is herein referred to as a dielectric core 62.

The dielectric core 62 can be vertically recessed below a horizontal plane including the top surface of the second insulating cap layer 270 prior to, during, or after removal of the horizontal portions of the memory film 50 from above the horizontal plane including the top surface of the second insulating cap layer 270. Subsequently, a doped semiconductor material having a doping of the first conductivity type can be deposited within the recessed volumes overlying the dielectric cores 62 inside the inter-tier memory openings 49 to form n-doped regions 63. For example, the n-doped regions 63 can include n-doped polysilicon or n-doped amorphous silicon that can be converted into n-doped polysilicon in a subsequent anneal process. The dopant (e.g., phosphorus or arsenic) concentration in the n-doped regions 63 can be in a range from $3.0 \times 10^{19}/cm^3$ to $3.0 \times 10^{21}/cm^3$, such as from $1.0 \times 10^{20}/cm^3$ to $1.0 \times 10^{21}/cm^3$, although lesser and greater dopant concentrations can also be employed. Each combination of an n-doped region 63 and an underlying semiconductor channel 60 forms a p-n junction.

Each combination of a memory film 50 and a semiconductor channel 60 within an inter-tier memory opening 49 constitutes a memory stack structure 55. The memory stack structure 55 is a combination of a semiconductor channel 60, a tunneling dielectric layer 56, a plurality of memory elements as embodied as portions of the charge storage layer 54, and a blocking dielectric layer 52. Each combination of a memory stack structure 55, a dielectric core 62, and an n-doped region 63 within an inter-tier memory opening 49 constitutes a memory opening fill structure 58. The same combination can be formed within each support opening to provide support pillar structured in the contact region 300. The support pillar structures are electrically inactive structures that provide structural support during subsequent replacement of the first sacrificial material layers 142 and the undoped sacrificial semiconductor layer 114.

Thus, each memory stack structure 55 includes a semiconductor channel 60 and a memory film 50 laterally surrounding the vertical semiconductor channel 60. An array of memory opening fill structures 58 can extend through each of the at least one alternating stack (132, 142, 232, 242) and into an upper portion of the p-doped source semiconductor layer 112.

While the present disclosure is described employing an embodiment in which a first alternating stack (132, 142) and a second alternating stack (232, 242) are employed, the methods of the present disclosure can be modified to form at least one additional alternating stack of additional insulating layers and additional sacrificial material layers. In this case, additional sacrificial memory opening fill structures and additional support opening fill structures may be formed in all tier structures except the topmost tier structure. Further, the methods of the present disclosure may be modified to omit formation of the second alternating stack (232, 242), in which case the memory opening fill structures 58 and support opening fill structures can be formed in the first memory openings 49 and in the first support openings, respectively, while omitting the processing steps of FIGS. 6, 7A-7C, and 8. Such variations are expressly contemplated herein.

Generally, an array of memory stack structures 55 can be formed through at least one alternating stack (132, 142, 232, 242) and into an upper portion of the p-doped source semiconductor layer 112. Each memory stack structure 55 includes a p-doped vertical semiconductor channel 60 and a memory film 50 laterally surrounding the p-doped vertical semiconductor channel 60. Each memory film 50 and each p-doped vertical semiconductor channel 60 can be formed by a conformal deposition method.

An n-doped region (i.e., drain region) 63 is provided at an upper end of each of the p-doped vertical semiconductor channels 60. Each adjoining combination of an n-doped region 63 and a p-doped vertical semiconductor channel 60 constitutes a multi-gated p-n diode (63, 60). A hole current is controlled by bias voltages applied to the electrically conductive layers (i.e., word lines which function as control gate electrodes) to be subsequently formed at the levels of the sacrificial material layers (142, 242) in each of the multi-gated p-n diodes (63, 60).

Figure 11:
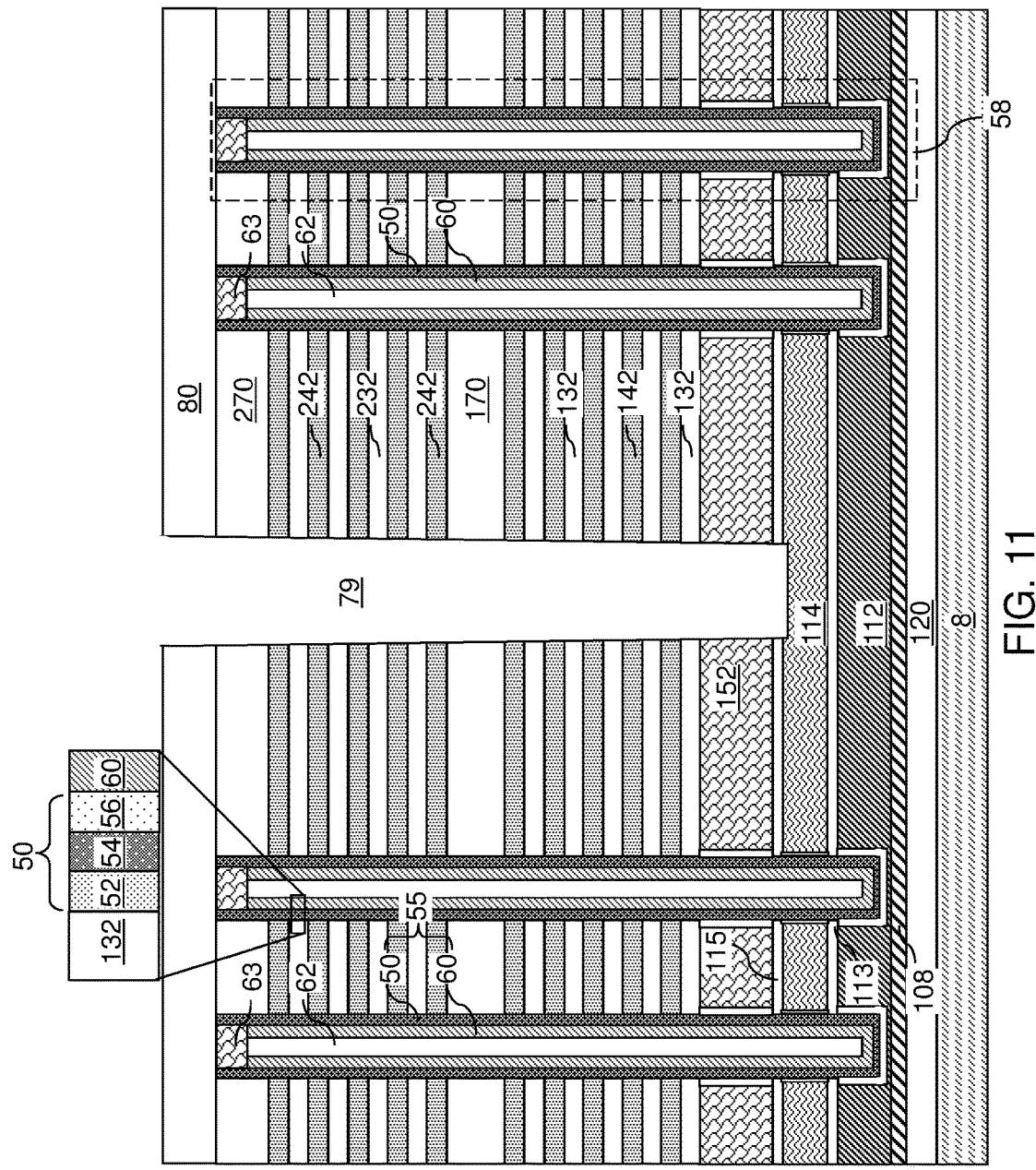
FIG. 11 is vertical cross-sectional view of the exemplary structure after formation of a backside trench according to an embodiment of the present disclosure.

Referring to FIG. 11, a contact level dielectric layer 80 can be optionally formed over the second insulating cap layer 270. The contact level dielectric layer 80 includes a dielectric material that is different from the dielectric material of the first and second sacrificial material layers (142, 242). For example, the contact level dielectric layer 80 can include silicon oxide. The contact level dielectric layer 80 can have a thickness in a range from 50 nm to 500 nm, although lesser and greater thicknesses can also be employed.

A photoresist layer (not shown) can be applied over the contact level dielectric layer 80, and can be lithographically patterned to form openings in areas between clusters (e.g., blocks) of memory opening fill structures 58. The pattern in the photoresist layer can be transferred through the contact level dielectric layer 80, the at least one alternating stack (132, 142, 232, 242) and/or the at least one retro-stepped dielectric material portion (165, 265) employing an anisotropic etch to form backside trenches 79. The backside trenches 79 vertically extend from the top surface of the contact level dielectric layer 80, through each of the at least one alternating stack (132, 142, 232, 242), the p-doped etch stop semiconductor layer 152, the upper silicon oxide layer 115 and to or partially into the undoped sacrificial semiconductor layer 114. In one embodiment, the p-doped etch stop semiconductor layer 152 can be employed as an etch stop layer for etching through the at least one alternating stack (132, 142, 232, 242). Subsequently, the upper silicon oxide layer 115 can be employed as an etch stop layer for etching through the p-doped etch stop semiconductor layer 152. The upper silicon oxide layer 115 can be etched through thereafter employing a different etch chemistry. The backside trenches 79 can be formed between clusters (e.g., blocks) of memory opening fill structures 58. The photoresist layer can be removed, for example, by ashing.

Figure 12:
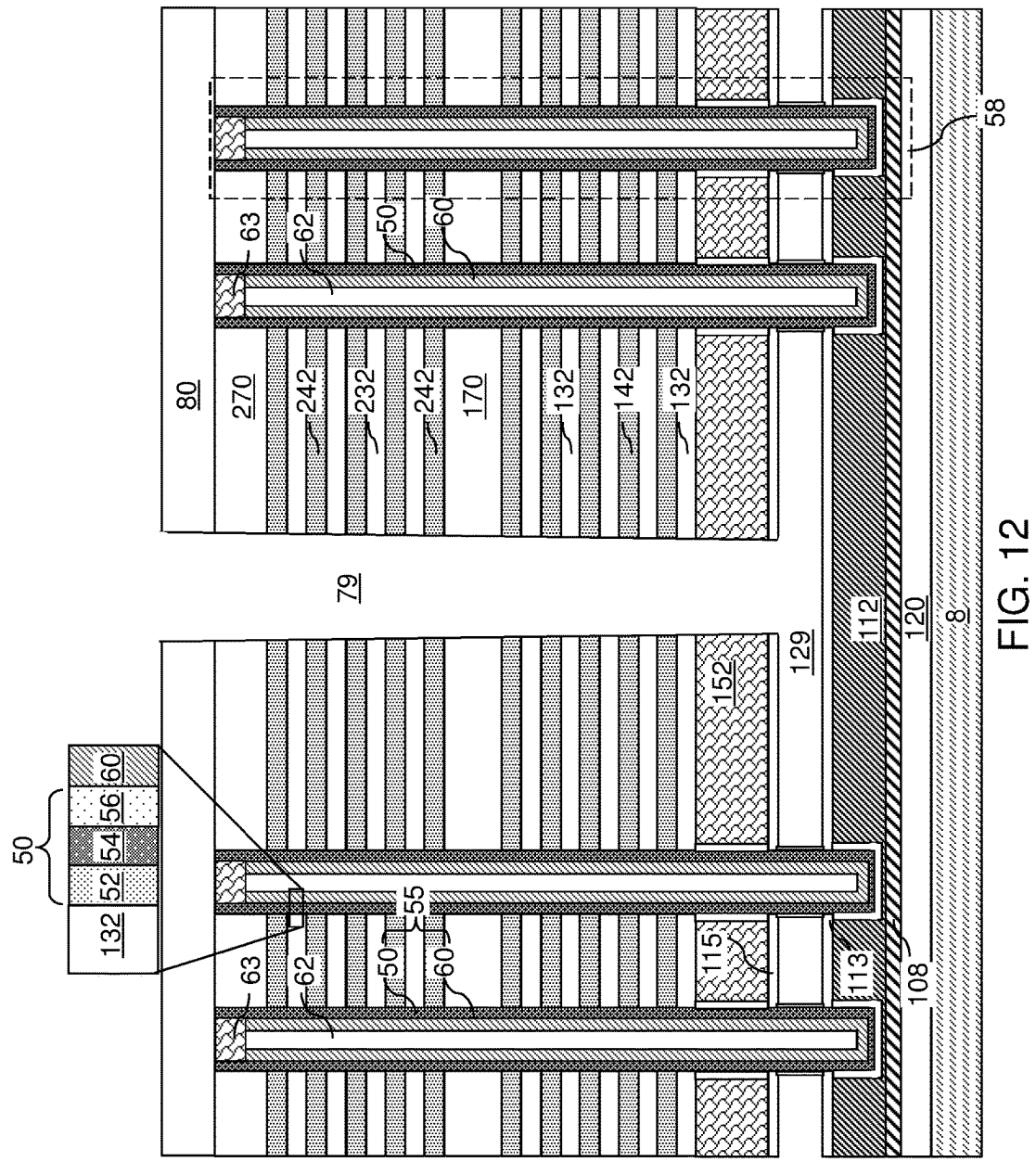
FIG. 12 is a vertical cross-sectional view of the exemplary structure after formation of a source cavity according to an embodiment of the present disclosure.

Referring to FIG. 12, a first isotropic etch process can be performed employing an etchant that etches the material of the undoped sacrificial semiconductor layers 114 (e.g., undoped polysilicon) selective to the material of the p-doped etch stop semiconductor layer 152 (e.g., p-doped polysilicon), the materials of the at least one alternating stack (132, 142, 232, 242), the first and second insulating cap layers (170, 270) (which can include silicon oxide, for example), the contact level dielectric layer 80, the upper and lower silicon oxide lines (115, 113), and the second oxide rings 514. The etchant can be introduced through the backside trenches 79. The etchant can be a liquid phase etchant applied in a wet etch process, or a gas phase etchant applied in a dry etch process. In an illustrative example, a wet etch process employing a trimethyl-2 hydroxyethyl ammonium hydroxide (TMY) solution may be employed to isotropically etch the undoped sacrificial semiconductor layer 114 selective to other material portions. The undoped sacrificial semiconductor layer 114 can be completely removed. A source cavity 129 can be formed by removal of the undoped sacrificial semiconductor layer 114.

Figure 13A:
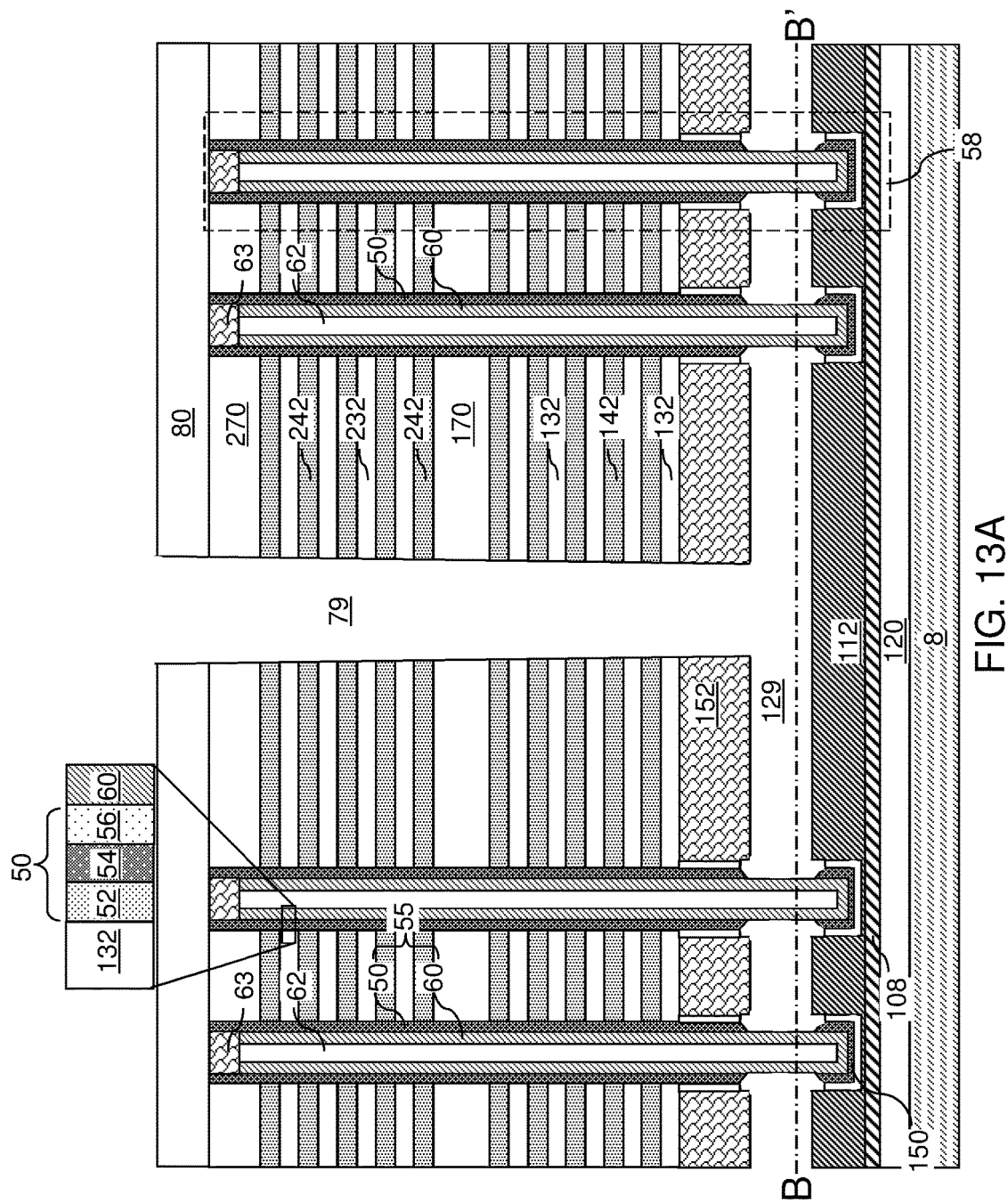
FIG. 13A is a vertical cross-sectional view of the exemplary structure after expansion of the source cavity by removal of the lower and upper silicon oxide liners, the second silicon oxide rings, and portions of the memory films located at the level of the source cavity according to an embodiment of the present disclosure.
Figure 13B:
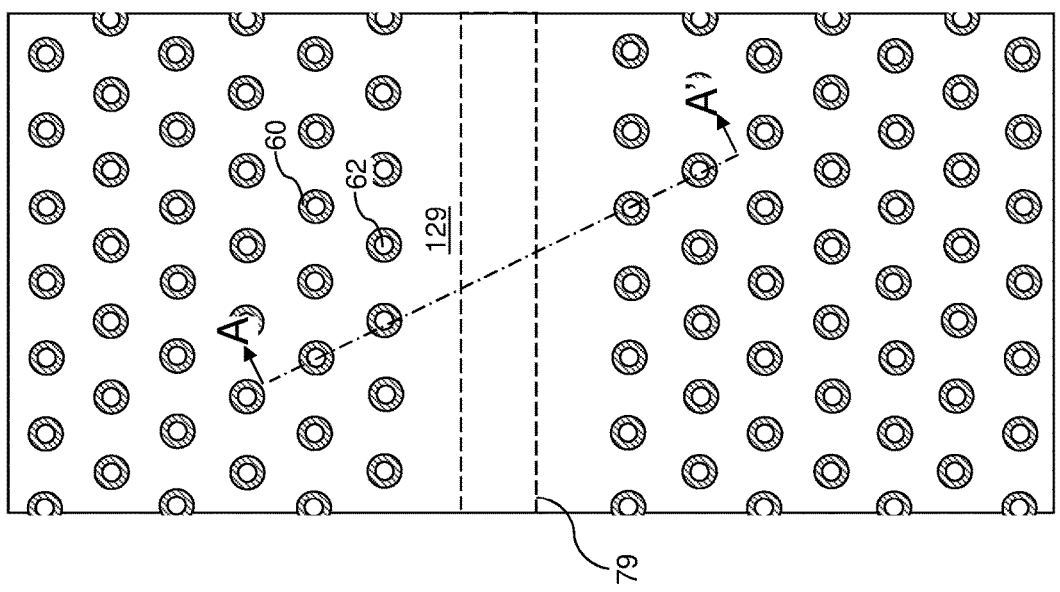
FIG. 13B is a top-down view of the exemplary structure of FIG. 13A. The plane A-A' is the plane of the vertical cross-section of FIG. 13A.

Referring to FIGS. 13A-13C, a second isotropic etch process can be performed by introducing at least another etchant through the backside trenches 79 into the source cavities 119. The second isotropic etch process removes materials of the second silicon oxide rings 514 (i.e., silicon oxide) and the memory films 50 selective to the materials of the p-doped etch stop semiconductor layer 512, the p-doped source semiconductor layer 112, and the p-doped vertical semiconductor channels 60. For example, the second isotropic etch process can include a first etch step that etches the material of the second silicon oxide rings 514 (i.e., silicon oxide) and any silicon oxide material portion of the blocking dielectric layer 52, an optional etch step that etches any additional material layer within the blocking dielectric layer 52, a second etch step that etches the material of the charge storage layer 54, and a third etch stop that etches the material of the tunneling dielectric layer 56. In an illustrative example, the blocking dielectric layer 52 can include silicon oxide, the charge storage layer 54 can include silicon nitride, and the tunneling dielectric layer 56 can include silicon oxide or an ONO stack. In this case, the first etch step can include a wet etch or a vapor phase etch employing hydrofluoric acid, the second etch step can employ a wet etch employing hot phosphoric acid, and the third etch step can employ another etch step employing hydrofluoric acid.

The lower and upper silicon liners (113, 115) can be collaterally etched during the first etch step. Any remaining portion of the lower and upper silicon liners (113, 115) after the first etch step, if present, can be completely removed by a collateral etch during the third etch step. The entirety of each second silicon oxide ring 514 can be removed during the first etch step. Further, a lower portion of each first silicon oxide ring 516 and an upper portion of each silicon oxide cap 512 can be collaterally etched during the first etch step. Portions of the memory films 50 at the level of the source cavity 129 can be removed over the first, second, and third etch steps. Outer sidewalls of the p-doped vertical semiconductor channels 60 are physically exposed by removing portions of the memory films 50 at the level of the source cavity 129. Outer sidewalls of each laterally protruding ring 60PR of the p-doped vertical semiconductor channels 60 can be physically exposed to the source cavity 129. The laterally protruding ring 60PR of the p-doped vertical semiconductor channels 60 protrude outward from each dielectric core 62 that the respective p-doped vertical semiconductor channel 60 laterally surrounds.

A bottom portion of each memory film 50 is physically separated from the remaining upper portion of the memory film 50 by an annular cavity that forms a portion of the source cavity 129. Each physically separated bottom portion of the memory film 50 is referred to as a memory material cap portion 150. Each memory material cap portion 150 includes a first dielectric plate having the same thickness and the same composition as the blocking dielectric layer 52, a second dielectric plate having the same thickness and the same composition as the charge storage layer 54, and a third dielectric plate having the same thickness and the same composition as the tunneling dielectric layer 56. Each dielectric plate can have a planar portion and a cylindrical portion that is adjoined to a periphery of the planar portion.

The top surface of the p-doped source semiconductor layer 112 and the bottom surface of the p-doped etch stop semiconductor layer 152 are physically exposed to the source cavity 129. Further, a cylindrical sidewall surface of the p-doped source semiconductor layer 112 and a cylindrical sidewall surface of the p-doped etch stop semiconductor layer 152 are physically exposed around each physically exposed surface of the p-doped vertical semiconductor channels 60.

Figure 14A:
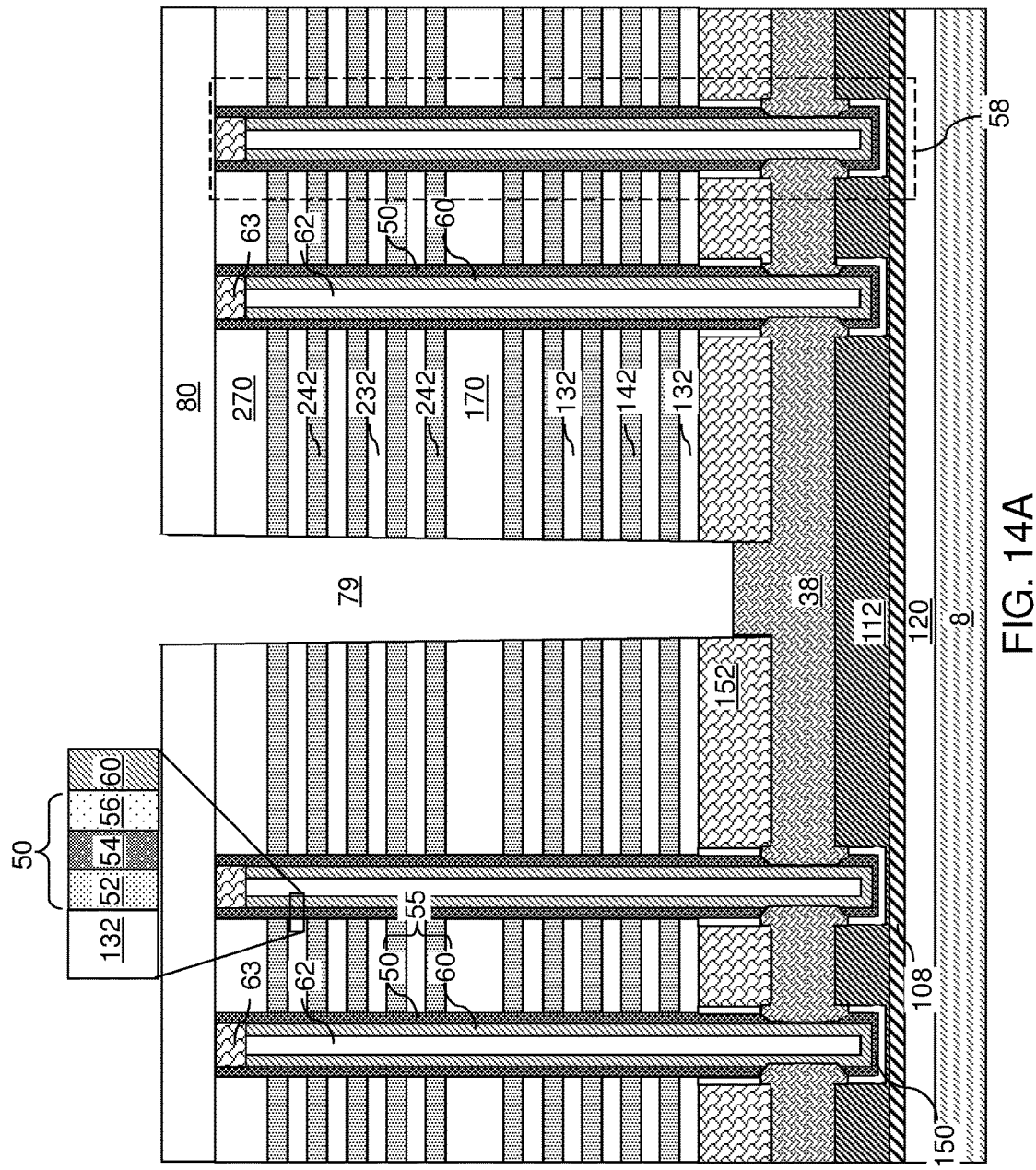
FIG. 14A is a vertical cross-sectional view of the exemplary structure after formation of a strap semiconductor layer having a p-type doping according to an embodiment of the present disclosure.
Figure 14B:
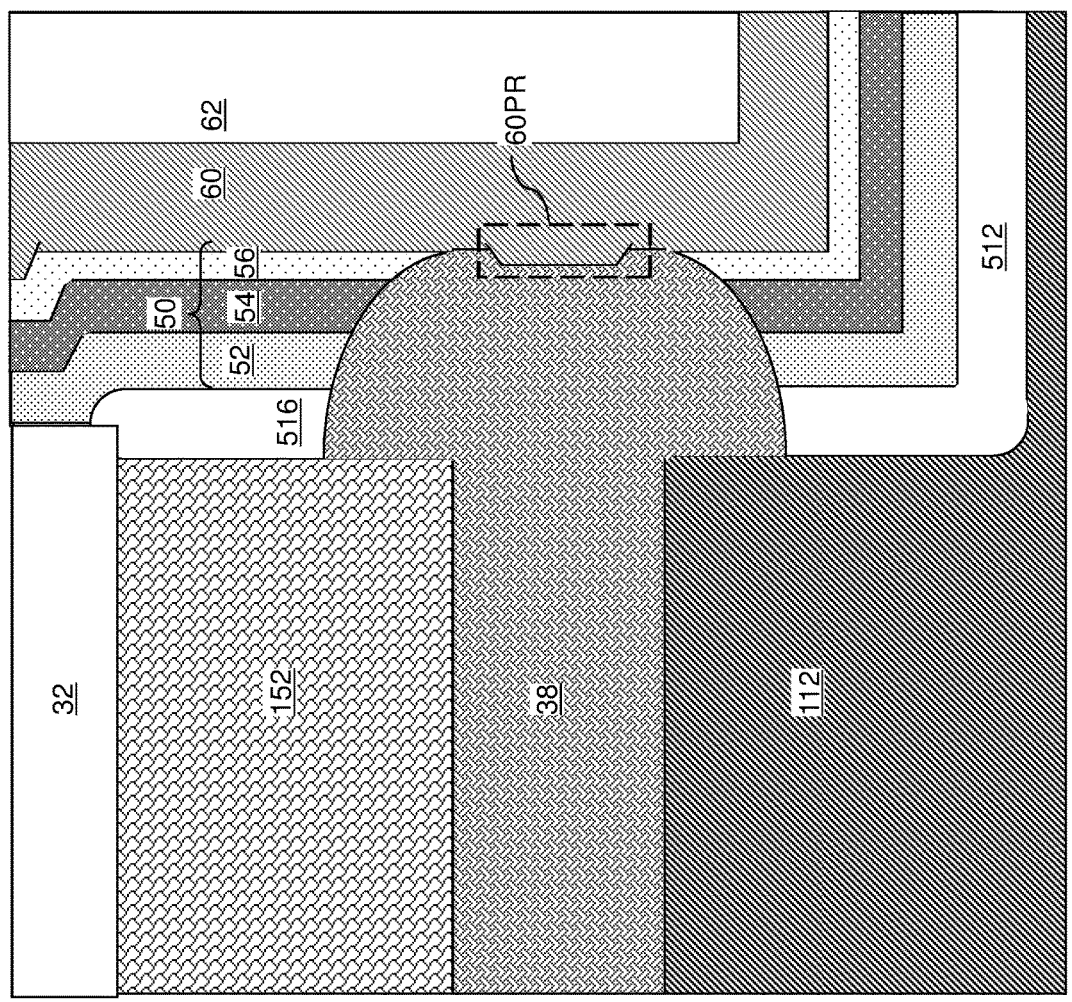
FIG. 14B is a magnified vertical cross-sectional view of a bottom corner of a memory opening of the exemplary structure of FIG. 14A.

Referring to FIGS. 14A and 14B, a direct strap contact structure comprising a strap semiconductor layer 38 having a p-type doping can be formed in the source cavity 129. The strap semiconductor layer 38 can be deposited by a selective deposition process in which a p-doped semiconductor material grows selectively only from physically exposed semiconductor surfaces, and does not grow the p-doped semiconductor material from dielectric surfaces.

A selective semiconductor deposition process is a deposition process in which a reactant for depositing a semiconductor material and an etchant that etches the semiconductor material are concurrently or alternately flowed into a process chamber such that the etch rate of the semiconductor material provided by the etchant is between the higher growth rate of the semiconductor material on semiconductor surfaces and the lower growth rate (or the nucleation rate) of the semiconductor material on dielectric surfaces. A net deposition of the semiconductor material occurs only on the semiconductor surfaces, and the semiconductor material does not grow from the dielectric surfaces. A p-type dopant (such as $B_2H_6$) can be flowed concurrently with the reactant for deposition of the semiconductor material to provide in-situ doping of the deposited semiconductor material. Alternatively or in addition, the p-type dopant (e.g., boron) can be diffused into layer 38 from at least one of layers 114 and/or 152 during deposition of layer 38 or during a post-deposition anneal. The deposited p-doped semiconductor material may be polycrystalline if the underlying semiconductor surfaces are polycrystalline or amorphous, or single crystalline (epitaxial) or polycrystalline if the underlying semiconductor surfaces are single crystalline.

The p-doped semiconductor material can grow directly from the physically exposed outer sidewall surfaces of the p-doped vertical semiconductor channels 60, the physically exposed surfaces of the p-doped source semiconductor layer 112, and the physically exposed surfaces of the p-doped etch stop semiconductor layer 152. Thus, the strap semiconductor layer 38 is formed directly on the p-doped source semiconductor layer 112 and the p-doped etch stop semiconductor layer 152. The various portions of the p-doped semiconductor material that grow from the semiconductor surfaces can merge to form the strap semiconductor layer 38, which can be a single continuous layer.

Each portion of the source cavity 129 that protrudes upward above the horizontal plane including the bottom surface of the p-doped etch stop semiconductor layer 152 and laterally surrounds a respective p-doped vertical semiconductor channel 60 is filled by a portion of the strap semiconductor layer 38. Likewise, each portion of the source cavity 129 that protrudes downward below the horizontal plane including the top surface of the p-doped source semiconductor layer 112 and laterally surrounds a respective p-doped vertical semiconductor channel 60 is filled by a portion of the strap semiconductor layer 38. Thus, the strap semiconductor layer 38 can be formed with upward-protruding portions that contact remaining portions of the first silicon oxide rings 516 and downward-protruding portions that contact remaining portions of the silicon oxide caps 512.

In one embodiment, each laterally protruding ring 60PR of the p-doped vertical semiconductor channels 60 contacts a respective laterally recessed sidewall of the strap semiconductor layer 38.

Figure 15:
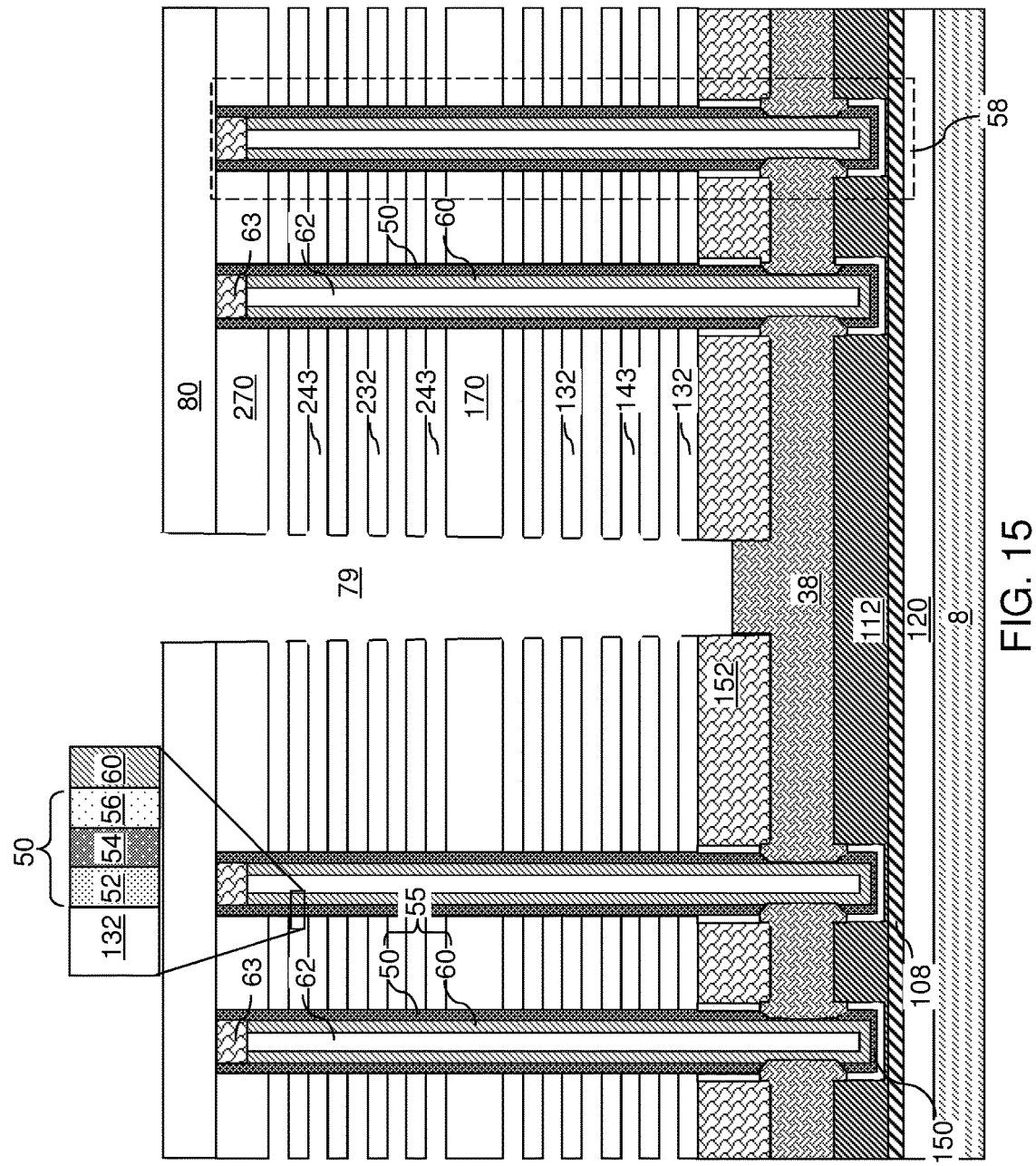
FIG. 15 is a vertical cross-sectional view of the exemplary structure after formation of backside recesses according to an embodiment of the present disclosure.

Referring to FIG. 15, an etchant that selectively etches the material of the sacrificial material layers (142, 242) with respect to the materials of the insulating layers (132, 232), the first and second insulating cap layers (170, 270), the contact level dielectric layer 80, the strap semiconductor layer 38, the retro-stepped dielectric material portions (165, 265), and the outermost layer of the memory films 50 (e.g., the blocking dielectric layer 52) can be introduced into the backside trenches 79 employing an isotropic etch process such as a wet etch process. First backside recesses 143 are formed in volumes from which the first sacrificial material layers 142 are removed. Second backside recesses 243 are formed in volumes from which the second sacrificial material layers 242 are removed.

In one embodiment, the sacrificial material layers (142, 242) can include silicon nitride, and the materials of the insulating layers (132, 232) and the retro-stepped dielectric material portions (165, 265) can include silicon oxide materials. In this case, a wet etch employing hot phosphoric acid can be employed to form the backside recesses (143, 243). The memory opening fill structures 58 in the memory array region 100, the support pillar structure provided in the contact region 300, and the retro-stepped dielectric material portions (165, 265) can provide structural support while the backside recesses (143, 243) are present within volumes previously occupied by the sacrificial material layers (142, 242).

Each backside recess (143, 243) can be a laterally extending cavity having a lateral dimension that is greater than the vertical extent of the cavity. In other words, the lateral dimension of each backside recess (143, 243) can be greater than the height of the backside recess (143, 243). A plurality of backside recesses (143, 243) can be formed in the volumes from which the sacrificial material layers (142, 242) are removed. The memory openings in which the memory opening fill structures 58 are formed are herein referred to as front side openings or front side cavities in contrast with the backside recesses (143, 243). In one embodiment, the memory array region 100 comprises an array of monolithic three-dimensional NAND strings having a plurality of device levels disposed above the semiconductor substrate 8. In this case, each backside recess (143, 243) can define a space for receiving a respective word line of the array of monolithic three-dimensional NAND strings. Each of the plurality of backside recesses (143, 243) can extend substantially parallel to the top surface of the semiconductor substrate 8. In one embodiment, each backside recess (143, 243) can have a uniform height throughout.

Figure 16:
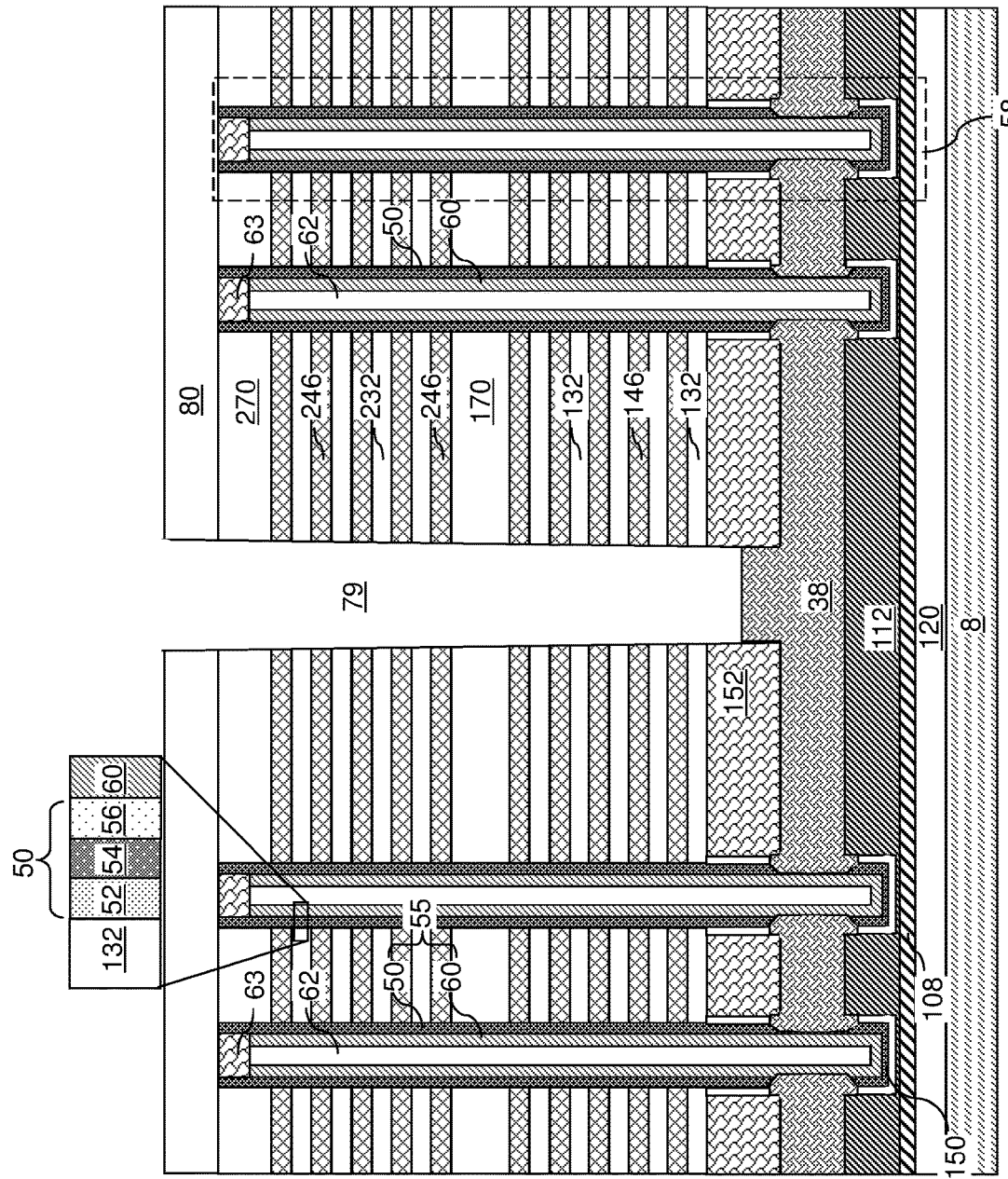
FIG. 16 is a vertical cross-sectional view of the exemplary structure after deposition of at least one conductive material to form electrically conductive layers and a continuous metallic material layer according to an embodiment of the present disclosure.

Referring to FIG. 16, a backside blocking dielectric layer (not shown) can be optionally formed as a continuous material layer in the backside recesses (143, 243) and the backside trenches 79 and over the contact level dielectric layer 80. The backside blocking dielectric layer, if present, comprises a dielectric material that functions as a control gate dielectric for the control gates to be subsequently formed in the backside recesses (143, 243). At least one metallic material can be subsequently deposited in the backside recesses (143, 243) and the backside trenches 79. For example, a combination of a metallic barrier layer (which may include a conductive metallic nitride material such as TiN, TaN, WN, or a stack thereof) and at least one metal fill material layer (such as a tungsten layer) can be deposited by conformal deposition processes such as chemical vapor deposition (CVD) or atomic layer deposition (ALD). A plurality of electrically conductive layers (146, 246) can be formed in the plurality of backside recesses (143, 243), and a continuous metallic material layer (not shown) can be formed on the sidewalls of each backside trench 79 and over the contact level dielectric layer 80. The electrically conductive layers (146, 246) include first electrically conductive layers 146 that are formed in volumes of the first backside recesses 143, and second electrically conductive layers 246 that are formed in volumes of the second backside recesses 243. Each electrically conductive layer (146, 246) can include a portion of the metallic barrier layer and a metallic fill material portion. Thus, each first sacrificial material layer 142 can be replaced with a first electrically conductive layer 146, and each second sacrificial material layer 242 can be replaced with a second electrically conductive layer 246. A backside cavity is present in the portion of each backside trench 79 that is not filled with the backside blocking dielectric layer and the continuous metallic material layer.

The deposited metallic material of the continuous electrically conductive material layer is etched back from the sidewalls of each backside trench 79 and from above the contact level dielectric layer 80, for example, by an isotropic wet etch, an anisotropic dry etch, or a combination thereof. Each remaining portion of the deposited metallic material in the backside recesses (143, 243) constitutes an electrically conductive layer (146, 246). Each electrically conductive layer (146, 246) can be a conductive line structure (e.g., word line which functions as control gate electrodes of plural NAND strings). Thus, the sacrificial material layers (142, 242) are replaced with the electrically conductive layers (146, 246).

Each electrically conductive layer (146, 246) can function as a combination of a plurality of control gate electrodes located at a same level and a word line electrically interconnecting, i.e., electrically shorting, the plurality of control gate electrodes located at the same level. The plurality of control gate electrodes within each electrically conductive layer (146, 246) can include the control gate electrodes for the vertical memory devices including the memory opening fill structures 58. In other words, each electrically conductive layer (146, 246) can be a word line that functions as a common control gate electrode for the plurality of vertical memory devices. One or more of the uppermost electrically conductive layers 246 can function as a drain select gate of a vertical NAND string, while one or more of the lowermost electrically conductive layers 146 can function as a source select gate electrode of the vertical NAND string.

Figure 17A:
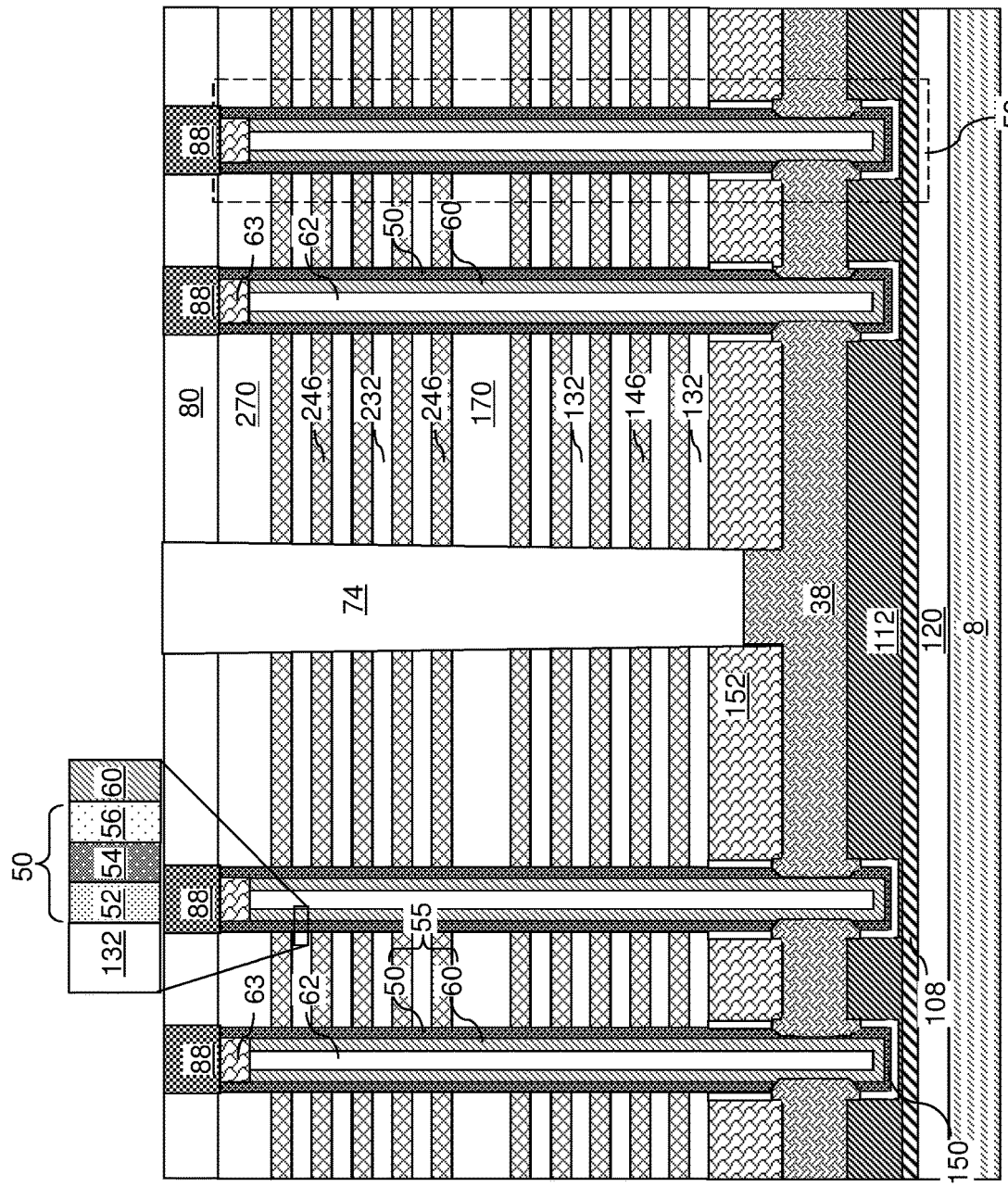
FIG. 17A is a vertical cross-sectional view of the memory region of the exemplary structure after formation of a dielectric trench fill structure and various contact via structures according to an embodiment of the present disclosure.
Figure 17B:
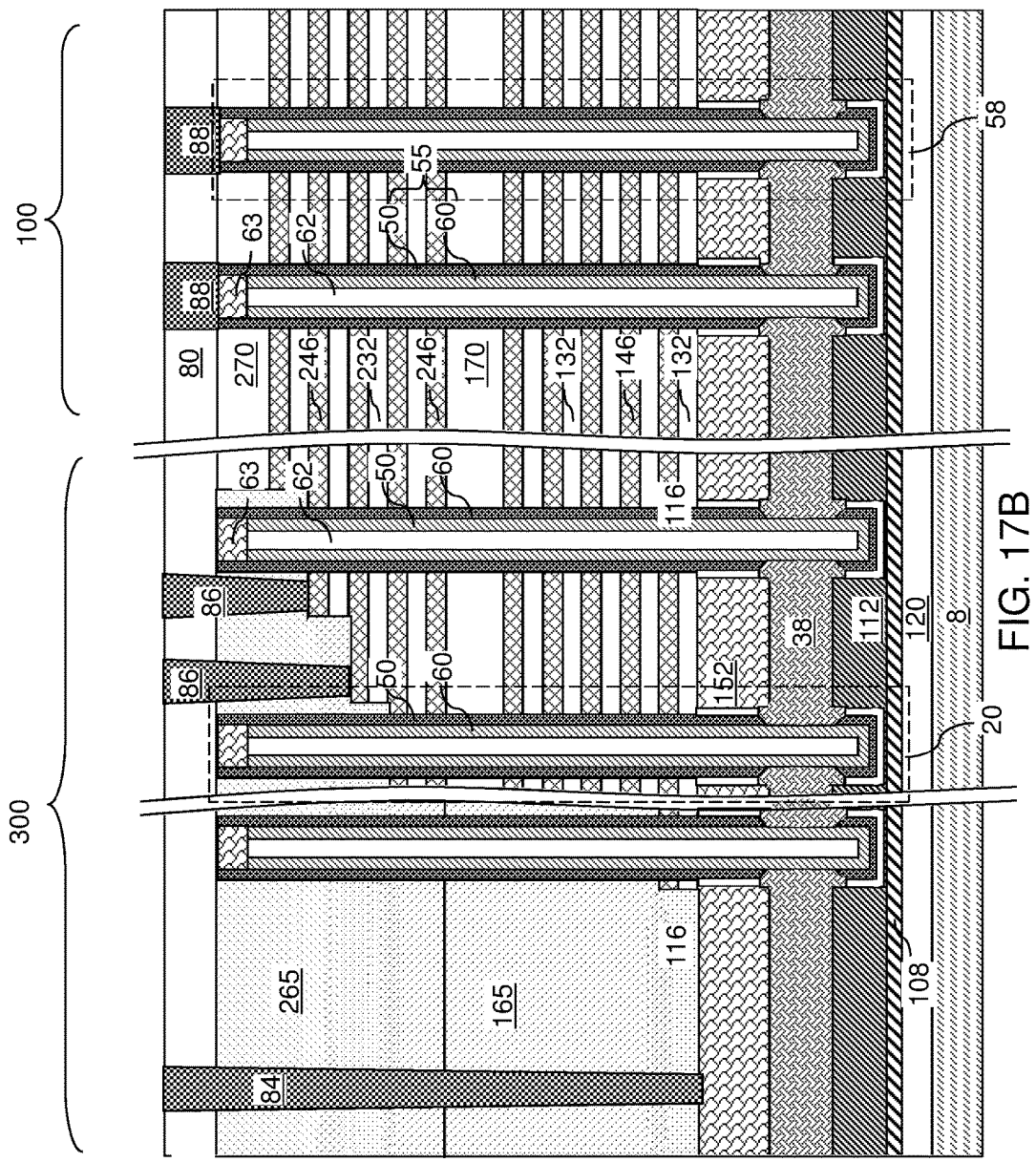
FIG. 17B is a vertical cross-sectional view of another region of the exemplary structure after the processing step of FIG. 17A.

Referring to FIGS. 17A and 17B, an insulating material (such as silicon oxide) can be deposited in the backside trenches 79 to form a dielectric wall structure 74 in each backside trench 79. Excess portions of the insulating material overlying the contact level dielectric layer 80 may, or may not, be removed. Each dielectric wall structure 74 contacts sidewalls of the insulating layers (132, 232) and the electrically conductive layers (146, 246) and top surfaces of the strap semiconductor layer 38.

Contact via structures (84, 86, 88) can be formed through the contact level dielectric layer 80, and through the retro-stepped dielectric material portions (165, 265). For example, n-doped region (e.g., drain) contact via structures 88 can be formed through the contact level dielectric layer 80 on each n-doped drain region 63. Word line contact via structures 86 can be formed on the electrically conductive layers (146, 246) through the contact level dielectric layer 80, and through the retro-stepped dielectric material portions 65. A source select gate electrode contact via structure 84 extending through the retro-stepped dielectric material portions (165, 265) can be formed on the p-doped etch stop semiconductor layer 152 and/or in contact with one or more of layers 108, 114 or 38. Additionally, peripheral device contact via structures (not shown) can be formed through the retro-stepped dielectric material portions (165, 265) on respective nodes of the peripheral devices directly and/or through the various lower level metal interconnect structures 780 within the at least one lower level dielectric layer 120. Support pillar structures 20 can be interspersed among the word line contact via structures 86.

The various embodiments of the present disclosure provide a three-dimensional memory device which comprises a p-doped source semiconductor layer 112 located over a substrate 8, a p-doped strap semiconductor layer 38 located over the p-doped source semiconductor layer 112, an alternating stack of electrically conductive layers (146, 246) and insulating layers (132, 232) located over the p-doped strap semiconductor layer 38, and memory stack structures 55 that extend through the alternating stack and into an upper portion of the p-doped source semiconductor layer 112. Each memory stack structure 55 includes a p-doped vertical semiconductor channel 60 and a memory film 50 laterally surrounding the p-doped vertical semiconductor channel. A top surface of each p-doped vertical semiconductor channel 60 contacts a bottom surface of a respective n-doped region 63, which can be a drain region. A sidewall of a bottom portion of each p-doped vertical semiconductor channel 60 contacts a respective sidewall of the p-doped strap semiconductor layer 38.

Each adjoining combination of a n-doped region 63 and a p-doped vertical semiconductor channel 60 constitutes a multi-gated p-n diode (63, 60) in which a read hole current is controlled by bias voltages applied to the electrically conductive layers (146 or 246), which can be word lines of the device. A method of operating the three-dimensional memory device includes reading the three-dimensional memory device by providing a read hole current from the p-doped strap semiconductor layer 38 to the p-doped vertical semiconductor channel 60, and erasing the three-dimensional memory device by providing an erase hole current from the p-doped strap semiconductor layer 38 to the p-doped vertical semiconductor channel 60.

In one embodiment, a bottom end of each memory film 50 terminates above a horizontal plane including an interface between the p-doped source semiconductor layer 112 and the strap semiconductor layer 38.

In one embodiment, the three-dimensional memory device further comprises memory material cap portions 150 that underlie, and are vertically spaced from, each of the memory films 50. The memory material cap portions 150 are embedded within the p-doped source semiconductor layer 112. In one embodiment, the three-dimensional memory device further comprises silicon oxide caps 512 underlying the memory material caps 150 and including a horizontal portion and a vertical peripheral portion that contacts a respective downward-protruding portion of the strap semiconductor layer 38.

In one embodiment, a p-doped etch stop semiconductor layer 152 is located in contact with a top surface of the strap semiconductor layer 38. In one embodiment, the three-dimensional memory device can further comprise silicon oxide rings 516 contacting a respective one of the memory films 50 and a respective sidewall of the p-doped etch stop semiconductor layer 152. In one embodiment, each of the silicon oxide rings 516 contacts a respective upward-protruding portion of the strap semiconductor layer 38 located above a horizontal plane including an interface between the strap semiconductor layer 38 and the p-doped etch stop semiconductor layer 152.

In one embodiment, the three-dimensional memory device can further comprise a retro-stepped dielectric material portion (165 or 265) overlying stepped surfaces of the alternating stack {(132, 146) or (232, 246)}, and a contact via structure 84 extending through the retro-stepped dielectric material portion (165 or 265) and electrically contacting the strap semiconductor layer 38 (e.g., directly or indirectly through the p-doped etch stop semiconductor layer 152).

In one embodiment, each of the p-doped vertical semiconductor channels 60 includes a laterally protruding ring 60PR that protrudes outward at a level of the strap semiconductor layer 38 and contacts a respective laterally recessed sidewall of the strap semiconductor layer 38.

In one embodiment, the three-dimensional memory device can further comprise a stack including, from bottom to top, at least one dielectric layer 120 and a metallic conductive layer 108 and located between the substrate 8 and the p-doped source semiconductor layer 112.

In one embodiment, the three-dimensional memory device comprises a monolithic three-dimensional NAND memory device. The electrically conductive layers (146, 246) comprise, or are electrically connected to, a respective word line of the monolithic three-dimensional NAND memory device. The substrate can comprise a silicon substrate. The monolithic three-dimensional NAND memory device can comprise an array of three-dimensional NAND strings over the silicon substrate, each of the three-dimensional NAND strings comprising a respective one of the memory stack structures 55.

At least one memory cell (containing a portion of a charge storage layer 54 at a level of an electrically conductive layer (146, 246)) in a first device level of the array of monolithic three-dimensional NAND strings can be located over another memory cell (containing another portion of the charge storage layer 54 at a level of another electrically conductive layer (146, 246)) in a second device level of the array of monolithic three-dimensional NAND strings. The silicon substrate can contain a peripheral device region comprising an integrated circuit comprising a driver circuit for the memory device located thereon. For example, the semiconductor devices 210 (illustrated in FIG. 1) can be employed as the integrated circuit including the driver circuit.

The electrically conductive layers (146, 246) can comprise a plurality of control gate electrodes having a strip shape extending substantially parallel to the top surface of the semiconductor substrate 8, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels 60, wherein at least one end portion of each of the plurality of semiconductor channels 60 extends substantially perpendicular to a top surface of the semiconductor substrate 8; and a plurality of charge storage elements (as embodied as charge trapping material portions). Each charge storage element can be located adjacent to a respective one of the plurality of semiconductor channels 60.

According to an aspect of the present disclosure, the p-doped etch stop semiconductor layer 152 can be employed as an etch stop layer during the portion of the anisotropic etch that etches the at least one alternating stack (132, 142, 232, 242) for formation of the backside trenches 79. For example, boron-doped polysilicon provides high selectivity to reactive ion etch chemistries that etch silicon oxide and silicon nitride. Thus, if the insulating layers (132, 232) include silicon oxide and if the sacrificial material layers (142, 242) include silicon nitride, boron-doped polysilicon in the p-doped etch stop semiconductor layer 152 can effectively function as an etch stop layer during formation of the backside trenches 79. Subsequently, the material of the p-doped etch stop semiconductor layer 152 can be anisotropically etched selective to the material of the upper silicon oxide liner 115 in another step of the anisotropic etch that vertically extends the backside trenches 79 to the sacrificial layer 114. Thus, the uniformity of the reactive ion etch process can be enhanced through use of the p-doped etch stop semiconductor layer 152.

In addition, the use of the p-doped semiconductor material prevents removal of the p-doped etch stop semiconductor layer 152 during removal of the sacrificial undoped semiconductor layer 114 because the wet etch process of layer 114 employing a TMY solution is selective to the p-doped semiconductor material of the p-doped etch stop semiconductor layer 152. This prevents or reduces the chance of a structural collapse of the layer stack above the etch stop semiconductor layer 152.

The thickness of the first silicon oxide rings 516 can be greater than the thickness of silicon oxide rings in structures having n-type semiconductor layers. The greater thickness of the first silicon oxide rings 516 can be advantageously employed to reduce or prevent undesirable isotropic etching (such as chemical dry etching (CDE)) of portions of the memory film 50 at the level of the p-doped etch stop semiconductor layer 152 during removal of the portions of the memory film 50 from the level of the source cavity 129.

In addition, the channel conductance can be increased, and the contact resistance between a p-doped strap semiconductor layer 38 and the p-doped channel 60 can be reduced in the structure of the present disclosure because a second p-n junction that is inherent in an npn transistor can be avoided in gated p-n junction diodes.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A three-dimensional memory device, comprising:
  a p-doped source semiconductor layer located over a substrate;
  a p-doped strap semiconductor layer located over the p-doped source semiconductor layer;
  an alternating stack of electrically conductive layers and insulating layers located over the p-doped strap semiconductor layer; and
  memory stack structures that extend through the alternating stack and into an upper portion of the p-doped source semiconductor layer,
  wherein:
    each memory stack structure includes a p-doped vertical semiconductor channel and a memory film laterally surrounding the p-doped vertical semiconductor channel;

a top surface of each p-doped vertical semiconductor channel contacts a bottom surface of a respective n-doped region; and a sidewall of a bottom portion of each p-doped vertical semiconductor channel contacts a respective sidewall of the p-doped strap semiconductor layer.

2. The three-dimensional memory device of claim 1, wherein a bottom end of each memory film terminates above a horizontal plane including an interface between the p-doped source semiconductor layer and the p-doped strap semiconductor layer.

3. The three-dimensional memory device of claim 1, further comprising memory material cap portions that underlie, and are vertically spaced from, each of the memory films, wherein the memory material cap portions are embedded within the p-doped source semiconductor layer.

4. The three-dimensional memory device of claim 3, further comprising silicon oxide caps underlying the memory material caps and including a horizontal portion and a vertical peripheral portion that contacts a respective downward-protruding portion of the p-doped strap semiconductor layer.

5. The three-dimensional memory device of claim 1, further comprising:

a p-doped etch stop semiconductor layer contacting a top surface of the p-doped strap semiconductor layer; and silicon oxide rings contacting a respective one of the memory films and a respective sidewall of the p-doped etch stop semiconductor layer.

6. The three-dimensional memory device of claim 5, wherein each of the silicon oxide rings contacts a respective upward-protruding portion of the p-doped strap semiconductor layer located above a horizontal plane including an interface between the p-doped strap semiconductor layer and the p-doped etch stop semiconductor layer.

7. The three-dimensional memory device of claim 6, further comprising:

at least one dielectric layer and a metallic conductive layer located between the substrate and the p-doped source semiconductor layer;

a retro-stepped dielectric material portion overlying stepped surfaces of the alternating stack; and a contact via structure extending through the retro-stepped dielectric material portion and electrically contacting the p-doped strap semiconductor layer.

8. The three-dimensional memory device of claim 1, wherein each of the p-doped vertical semiconductor channels includes a laterally protruding ring that protrudes outward at a level of the p-doped strap semiconductor layer and contacts a respective laterally recessed sidewall of the p-doped strap semiconductor layer.

9. The three-dimensional memory device of claim 1, wherein:

the three-dimensional memory device comprises a monolithic three-dimensional NAND memory device;

the electrically conductive layers comprise, or are electrically connected to, a respective word line of the monolithic three-dimensional NAND memory device;

the substrate comprises a silicon substrate;

the monolithic three-dimensional NAND memory device comprises an array of three-dimensional NAND strings over the silicon substrate, each of the three-dimensional NAND strings comprising a respective one of the memory stack structures;

at least one memory cell in a first device level of the array of monolithic three-dimensional NAND strings is located over another memory cell in a second device level of the array of monolithic three-dimensional NAND strings; and the silicon substrate contains a peripheral device region comprising an integrated circuit comprising a driver circuit for the memory device located thereon.

10. The three-dimensional memory device of claim 1, wherein each adjoining combination of the n-doped region and the p-doped vertical semiconductor channel constitutes a multi-gated p-n diode in which a read hole current is controlled by bias voltages applied to the electrically conductive layers during a reading step.

11. The three-dimensional memory device of claim 1, wherein:

the three-dimensional memory device is configured to be read by providing a read hole current from the p-doped strap semiconductor layer to the p-doped vertical semiconductor channel; and the three-dimensional memory device is configured to be erased by providing an erase hole current from the p-doped strap semiconductor layer to the p-doped vertical semiconductor channel.

* * * * *